(12) United States Patent
Sarkissian

(10) Patent No.: US 9,379,281 B2
(45) Date of Patent: Jun. 28, 2016

(54) FABRICATION OF THIN, FLEXIBLE, AND EFFICIENT LIGHT EMITTING DIODES

(71) Applicant: Raymond Sarkissian, Glendale, CA (US)

(72) Inventor: Raymond Sarkissian, Glendale, CA (US)

(*) Notice: Subject to any disclaimer, the term of this patent is extended or adjusted under 35 U.S.C. 154(b) by 0 days.

(21) Appl. No.: 14/696,294

(22) Filed: Apr. 24, 2015

(65) Prior Publication Data

US 2015/0311383 A1    Oct. 29, 2015

Related U.S. Application Data

(60) Provisional application No. 61/986,091, filed on Apr. 29, 2014.

(51) Int. Cl.
| | | |
|---|---|---|
| H01L 29/06 | (2006.01) |
| H01L 33/08 | (2010.01) |
| H01L 33/00 | (2010.01) |
| H01L 33/32 | (2010.01) |
| H01L 33/52 | (2010.01) |
| H01L 33/16 | (2010.01) |

(52) U.S. Cl.
CPC .......... *H01L 33/08* (2013.01); *H01L 33/0075* (2013.01); *H01L 33/0079* (2013.01); *H01L 33/0095* (2013.01); *H01L 33/16* (2013.01); *H01L 33/32* (2013.01); *H01L 33/52* (2013.01); *H01L 2933/005* (2013.01); *H01L 2933/0016* (2013.01)

(58) Field of Classification Search
CPC . H01L 33/08; H01L 33/0075; H01L 33/0079; H01L 33/0095; H01L 33/32; H01L 33/52
USPC ................................................. 257/13
See application file for complete search history.

(56) References Cited

U.S. PATENT DOCUMENTS

| | | | |
|---|---|---|---|
| 7,906,354 B1 | 3/2011 | Ellinger et al. |
| 8,183,576 B2 | 5/2012 | Min et al. |
| 8,383,493 B2 | 2/2013 | Wang |
| 8,669,544 B2 | 3/2014 | Mi et al. |
| 8,847,199 B2 | 9/2014 | Cha et al. |
| 2006/0223211 A1 | 10/2006 | Mishra et al. |
| 2012/0104409 A1 | 5/2012 | Chu et al. |

FOREIGN PATENT DOCUMENTS

| | | |
|---|---|---|
| JP | 2007266589 | 10/2007 |
| JP | 2012089900 | 5/2012 |

OTHER PUBLICATIONS

International Search Report and Written Opinion—PCT/US2015/027827—ISA/EPO—Aug. 7, 2015.

*Primary Examiner* — Douglas Menz
(74) *Attorney, Agent, or Firm* — Seyfarth Shaw LLP

(57) ABSTRACT

A light emitting structure may include a light emitting element(s) arranged in a transparent dielectric material. The light emitting element(s) may include a semiconductor nanostructure arranged in a display orientation different from a growth orientation of the semiconductor nanostructure. The light emitting element(s) may also include a well layer on the semiconductor nanostructure. The light emitting element(s) may further include a capping layer on the well layer. The light emitting structure may also include a contact layer coupled to the light emitting element(s).

26 Claims, 21 Drawing Sheets

FABRICATION OF THIN, FLEXIBLE, AND EFFICIENT LIGHT EMITTING DIODES

CROSS-REFERENCE TO RELATED APPLICATION

The present application claims the benefit of U.S. Provisional Patent Application No. 61/986,091, filed on Apr. 29, 2014 and titled "FABRICATION OF THIN, FLEXIBLE, AND EFFICIENT LIGHT EMITTING DIODES," the disclosure of which is expressly incorporated by reference herein in its entirety.

TECHNICAL FIELD

Aspects of the present disclosure relate to light emitting diodes, and more particularly to fabrication of thin, flexible and efficient light emitting structures.

BACKGROUND

Since the advent of blue gallium nitride (GaN)-based light emitting diodes (LEDs), they have been employed in technologies such as displays and general lighting (e.g., white-light LEDs). GaN-based blue LEDs are currently used for backlighting of LCD displays. The current technology, which is based on GaN-based thin-films grown on aluminum oxide (Al2O3), however, has several detrimental shortcomings. As the resolution of LCD display increases, there is a greater need for surface area backlighting. When using inorganic LEDs, backlighting is provided either by placing the LEDs directly behind the display or on the edge. Both these LED placements impose serious limitations on the manufacture of high-resolution and high-contrast displays. While the former method helps with better contrast, it makes the displays thicker and more expensive. The latter method, in conjunction with waveguiding, may reduce the thickness of the displays, but does not help to improve the contrast specified for high-resolution displays.

On the other hand, organic light emitting diodes (OLEDs) have been suggested to solve the rigidness problem of inorganic LEDs and are already in high demand due to their mechanical properties and their potential for high contrast LCD displays.

SUMMARY

A light emitting structure may include a light emitting element(s) arranged in a transparent dielectric material. The light emitting element(s) may include a semiconductor nanostructure arranged in a display orientation different from a growth orientation of the semiconductor nanostructure. The light emitting element(s) may also include a well layer on the semiconductor nanostructure. The light emitting element(s) may further include a capping layer on the well layer. The light emitting structure may also include a contact layer coupled to the light emitting element(s).

A method for manufacturing a light emitting structure includes fabricating a light emitting element(s) in a transparent dielectric material. The light emitting element(s) may include a semiconductor nanostructure arranged in a display orientation different from a growth orientation of the semiconductor nanostructure. The light emitting element(s) may also include a well layer on the semiconductor nanostructure. The light emitting element(s) may further include a capping layer on the well layer. The method may also include forming a contact layer coupled to the light emitting element(s).

A light emitting structure may include a light emitting element(s) arranged in a transparent dielectric material. The light emitting element(s) may include a means for coupling molecular structures arranged in a display orientation different from a growth orientation of the molecular structure coupling means. The light emitting element(s) may also include a well layer on the molecular structure coupling means. The light emitting element(s) may further include a capping layer on the well layer. The light emitting structure may also include a contact layer coupled to the light emitting element(s).

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
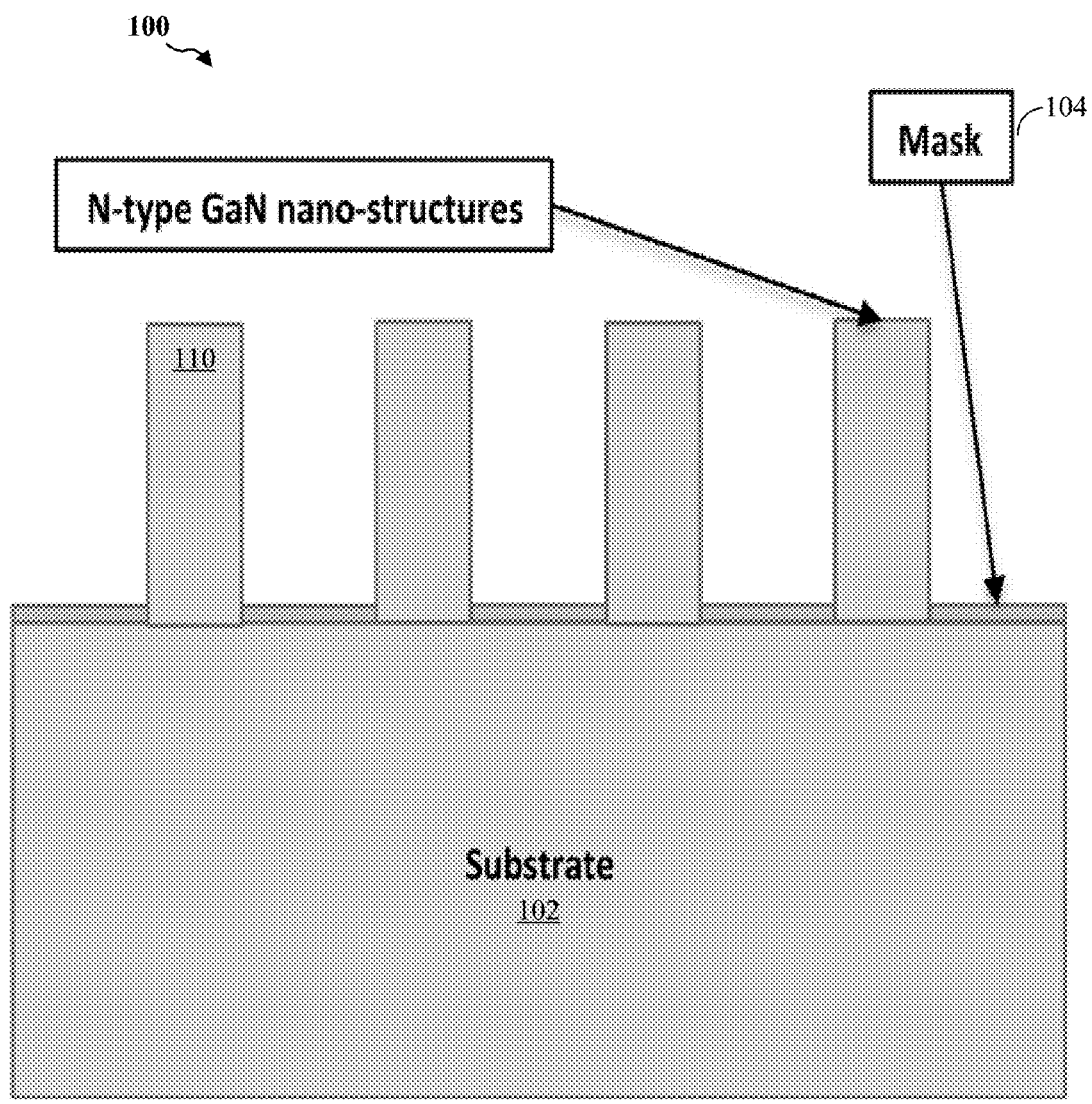
FIG. 1 is a block diagram depicting semiconductor nanostructures grown on a substrate according to an aspect of the present disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form to avoid obscuring such concepts. As described herein, the use of the term "and/or" is intended to represent an "inclusive OR", and the use of the term "or" is intended to represent an "exclusive OR".

The methods and structures described here allow for manufacture of very thin, flexible (if specified) and efficient light emitting devices with applications in displays and general lighting.

One aspect of the present disclosure provides a thin and efficient inorganic light emitter that combines the advantages of both OLEDs and LEDs. The particular choice of the material system, the type of nanostructures, the substrate, and dielectrics involved are merely exemplary without limiting the general scope of the present disclosure. Using semiconductor nanostructures can solve important issues in the manufacture of high-efficiency LEDs, such as the possibility of manufacturing high quality m-plane semiconductor substrates.

One aspect of the present disclosure describes a material structure in which an organic or inorganic material hosts semiconductors nanostructures that have been removed from the substrate in which they were originally fabricated. A transparent dielectric nanostructure sheets is one exemplary material structure. The hosting material may include one or more materials. The hosting material can also be another substrate, either by itself or further having other materials deposited on an active surface.

One aspect of the present disclosure includes the transfer of semiconductor nanostructures from their host substrate, in a growth orientation, to another matrix in which the semiconductor nanostructures are arranged in a display orientation. Other types of dielectrics, depending on the application and the material composition of the nanostructures, can be used as the new matrix that embeds the nanostructures. This new matrix can be, optically transparent or opaque depending on the application. Examples of material for this matrix may be selected from a group including silicon nitride ($SiN_x$), silicon oxide ($SiO_2$), silicon oxy-nitride (SiON), fluorinated silicon oxide (SiOF), silicon oxy-carbide (SiOC), hafnium oxide ($HfO_2$), hafnium-silicate (HfSiO), nitride hafnium-silicate (HfSiON), zirconium oxide ($ZrO_2$), aluminum oxide ($Al_2O_3$), barium strontium titanate (BST), lead zirconate titanate (PZT), zirconium silicate ($Zr\ SiO_2$), tantalum oxide ($TaO_2$) or any other material capable of withstanding high temperatures used in techniques of crystal growth according to one aspect of this disclosure. This matrix can also be a layered structure comprising aforementioned dielectrics. The matrix can also be a $SiO_2$-like material formed by thermal treatment or exposure to plasma of hydrogen silsesquioxane (HSQ) or similar polymers (i.e. sol-gel). The polymer-based techniques to achieve a dielectric layer are well known in the literature. The use of the resulting dielectric layer in MOCVD to achieve selective are growth has also been reported in the literature. Relatively thick layers (a few micrometers) of $SiO_2$-like matrix can be achieved by spin-coating HSQ and thermal or plasma treatment. Other materials that can be used as the matrix layer, according to one aspect of this disclosure, include but are not limited to polyimide, cyclotene, poly methyl methacrylate (PMMA), and similar polymers. The advantages in usage of polymers in semiconductor technologies have been noted in literature and may be applied here as well.

One aspect of the present disclosure relates to fabrication of devices based on semiconductor nanostructures that have been removed from their host substrate. As described herein the term "nanostructure" may include, but is not limited to, three-dimensional geometries such as sheets, rods, pyramids, and other like structures in which at least in one dimension are less than one-hundred (100) micrometers (μm). The nanostructures may or may not maintain their cross sectional form as they are grown on their host substrates. In their cross section they may be a circle, a polygon, or other geometric shapes that can be lithographically defined. The semiconductor nanostructures may be one or more heterostructures. As described herein, the term "substrate" may refer to a bulk material including, but not limited to, $Al_2O_3$, GaN, GaAs, Si, SiC, and other organic or inorganic substrates suitable for group III-Nitride semiconductor growth according to one aspect of this disclosure. The growth mechanism may be one of the crystal growth techniques, including, but not limited to, metal-organic chemical vapor deposition (MOCVD), molecular beam epitaxy (MBE), gas source MBE (GSMBE), metal-organic MBE (MOMBE), atomic layer epitaxy (ALE), hydride vapor phase epitaxy (HVPE), or organometallic vapor phase epitaxy (OMVPE).

As described herein, the symbol $SiN_x$ is interchangeably used to refer to variety of silicon nitride materials, with different compositions, grown or deposited using variety of machines, including but not limited to, MOCVD, LPCVD, PECVD or sputtering. $SiN_x$, depending on the composition and thickness, may have different optical and electrical properties, which are standard, and are known to those familiar with the art. Where necessary, a particular property of the $SiN_x$ material may be emphasized. For example transparent $SiN_x$ would refer to a $SiN_x$ grown with a suitable instrument to possess the property of being transparent within a desired electromagnetic spectrum.

One aspect of the present disclosure enables removal and transfer of the semiconductor nanostructures to another material (such as $SiN_x$). The removal and transfer of the nanostructures may be performed in a controlled fashion in which new layers of material are regrown on certain facets of the nanostructures using one of above-noted techniques. In this aspect of the disclosure, removal and transfer of the nanostructures enables formation of devices with improved electrical, thermal, and/or optical characteristics. In one configuration, a gallium nitride (GaN)-based light-emitter, provides a thin, flexible, and efficient light-emitting device with improved thermal, electronic, and optical characteristics. These gallium nitride (GaN)-based light emitters may be used in displays and general lighting devices (light bulbs) enabling manufacture of high resolution, high contrast and low power displays and more efficient lighting.

This technology pertains to fabrication of devices that are based on nanostructures. More specifically it focuses on fabrication of GaN-based light emitters that are very thin, which is of interest to display manufactures. We will show that the technology not only allows for fabrication of highly efficient thin GaN-based light emitters, but it also can be applied to fabricate high quality substrates, which then can be used for variety of applications.

One aspect of the present disclosure involves the transfer of miniature nanostructures, including but not limited to semiconductor nanostructure (e.g., GaN) sheets, from their host substrate to a new medium, including but not limited to $SiN_x$, $SiO_2$, or the like. A semiconductor nanostructure sheet may be originally grown on a c-plane inorganic (e.g., GaN) film in a growth orientation. After transfer, the nanostructure sheets are positioned in a matrix to regrow an inorganic layer (e.g., InGaN) on the m-plane facets of the sheets in a display orientation. After the transfer and positioning of nanostructure sheets in a matrix material (e.g., $SiN_x$) they are, either individually or in groups, used to form light emitting diodes (LEDs) that employ m-plane (e.g., InGaN) quantum wells for light emission and are encapsulated in a thin layer of a matrix material (e.g., $SiN_x$).

It should be noted that the choice of $SiN_x$ as the matrix material is exemplary and it may be replaced with any other transparent material that can withstand standard crystal growth conditions if a regrowth is necessary according to one aspect of this disclosure. Also note that right after transfer and positioning of the nanostructure sheets, it is possible to coalesce them by further growth making it possible to manufacture high quality m-plane substrates which then can be used for variety of purposes including fabrication of an light emitting diode (LED) based on the current state-of-the-art technology. This is because the nanostructures can be manufactured to be higher in quality with fewer defects than their planar and bulk counterparts.

Semiconductor nanostructure sheets may be grown on a c-plane semiconductor film on a suitable substrate (e.g., $Al_2O_3$) using selective area growth. The semiconductor nanostructures can also be grown on, bulk, free-standing substrates and the above mentioned substrate with the film should not be considered a limiting case. The semiconductor nanostructure sheets can have the following dimensions: 300 nm×1 μm×1 μm. The sheets are then sheared and positioned horizontally, with larger edge facing up, in the new matrix such as a $SiN_x$ layer that has been deposited on another substrate such as $Al_2O_3$ or Si. The nanostructure sheets can be put back in the crystal growth machine, as noted above, for GaN regrowth. The dimensions of the sheets are not limited to those mentioned above and can vary depending on the application. For example the dimensions of the sheets can tailored to achieve a photonic crystal effect when situated in the new matrix.

To form a P-N junction the nanostructure sheets are doped N type, before the transfer, during the original selective area growth according to one aspect this disclosure. After transfer to their new host, quantum wells are grown on the m-plane crystallographic face of the sheets. P-type GaN, creating nanostructure LEDs inside the new matrix, then caps the nanostructure sheets. Note that the fact that the structures were being grown on the m-plane face of the nanostructures should not be considered a limiting case rather it should be considered as an example.

Standard contact formation techniques such as conductor lift-off alongside with patterning and etching are then used to form contacts to electrically address the noted nanostructure LEDs. The composition of the contacts is material dependent. One such composition is Ti/Al/Ni/Au or Ta/Ti/Ni/Au for the N-type GaN and Ni/Au for the p-type GaN (Other configurations maybe used). The geometry and location of the contacts may vary from one application to another. For example the contacts may be formed such that electrical wire-bonding may be done on the same side of the device or may be such that the device can be electrically addressed from both sides. Issues such as current crowding and proper current distribution are also factors in designing the general geometry of the contacts and there is a large body of work on this topic in the literature. The LEDs may include one or more of the nanostructure sheets depending on the design. For example two or more of the nanostructure sheets may be coalesced before depositing the quantum wells forming a larger LED. The entire light emitter may or may not be encapsulated in $SiN_x$, $SiO_2$, or other like organic or inorganic materials.

As described herein, the term "the substrate" may refer to a substrate comprised of one or more materials suitable for growth of nanostructures. One such substrate is aluminum oxide $Al_2O_3$ with a GaN buffer layer. The term "the matrix" may refer to a material with proper thermal and optical properties suitable for selective area growth. The term "infill layer" may refer to an organic or inorganic material that can be used to encapsulate the nanostructures, which then may be resolved in suitable solvent. Examples of this infill layer include but are not limited to spin-on hydrogen silsesquioxane (HSQ) or similar polymers used in semiconductor processing. The term "solvent" may refer to suitable solvent capable of removing the infill layer mentioned above. For example in case of HSQ, the infill layer can be removed by $NaCl_2$/NaOH and further cleaned by application of water.

One aspect of the present disclosure includes the transfer of semiconductor nanostructure sheets, with a thickness of 500 nm or less and with a width and a height ranging from few hundred nanometers to few microns, to a new matrix such as $SiN_x$, $SiO_2$, or one of the noted materials. These sheets are extruding structures with a base that could be a certain geometrical shape as mentioned before. The sheets when positioned horizontally in this new matrix allow for growth of a new substrate on the top facets of the nanostructure sheets. As the defect density in nanostructures are known to be much less than planar thin films, due to reduction of stress, this technology allows for manufacture of high quality substrates. In particular if the nanostructure sheets are originally grown on a c-plane semiconductor film, then after laying the sheets horizontally the m-plane facets are accessible, which would allow for manufacture of high quality m-plane substrates. The particular crystallographic orientation of the exposed surfaces mentioned in previous sentence is exemplary and could be any other orientation.

A further aspect of the present disclosure includes regrowth of group III-nitride crystal layers on transferred nanostructure sheets that have been removed from their host substrate and placed within another matrix, which can withstand high temperatures used in the noted typical crystal growth techniques. This in essence makes it possible to manufacture new substrates by coalescing two or more of the above mentioned nanostructure sheets or build LEDs embedded in the this new matrix, which can be out of the noted matrix materials. According to one aspect of the disclosure, the nanostructures maybe severed from the base, leaving them laying down on their host substrate. According another other aspect the disclosure the nanostructures may be dispersed on another substrate or matrix layer after being severed from the base in their host substrate.

One aspect of the present disclosure enables direct, electrical addressing of individual nanostructure sheets, which may diminish crowding issues in LEDs.

Another aspect of the present disclosure eliminates use of a current distribution layer such as an indium tin oxide (ITO) layer that is commonly used in manufacture of LEDs. This is possible due to the miniature size of individual nanostructure sheets, which may be electrically addressed without a current distribution layer. The noted electrical addressing provides means for manufacture of ultra-high resolution LED displays, which is again due to miniature size of the nanostructure sheets.

One aspect of the present disclosure includes embedding the semiconductor nanostructures in another matrix, mentioned above. One configuration positions the individual sheets or nanostructures mentioned above in such manner to build a three dimensional (3D) array. The 3D array increases the amount of light generated in a certain volume, achieves a photonic crystal effect to control the flow of light, or both.

FIG. 1 is a block diagram 100 including semiconductor nanostructures 110 grown on a first host substrate 102 according to an aspect of the present disclosure. In this configuration, a process of manufacturing the light emitter structure begins by first growing semiconductor nanostructures on a c-plane (e.g., GaN) film on a c-plane (e.g., $Al_2O_3$) substrate by selective area growth using MOCVD or other like crystal growth techniques. A mask 104 is also provided on a surface of the first host substrate 102. Although described with reference to N-type semiconductor nanostructure sheets, it should be recognized that other noted forms of nanostructures may be provided. Also the crystallographic orientation is merely exemplary and other orientations may be used.

Figure 11:
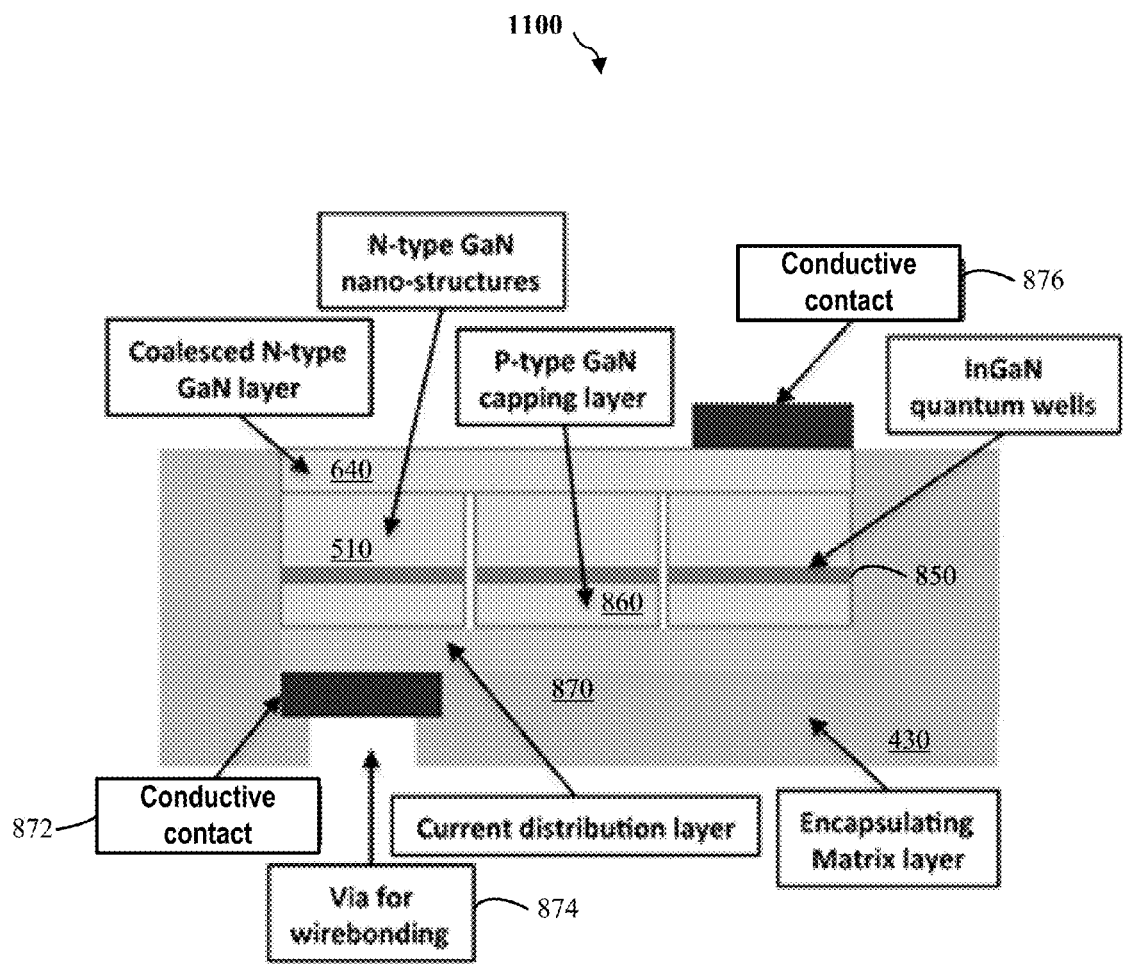
FIG. 11 depicts conductive contacts on N-type coalesced side of the light emitter alongside with vias for wire-bonding according to an aspect of the present disclosure.
Figure 12:
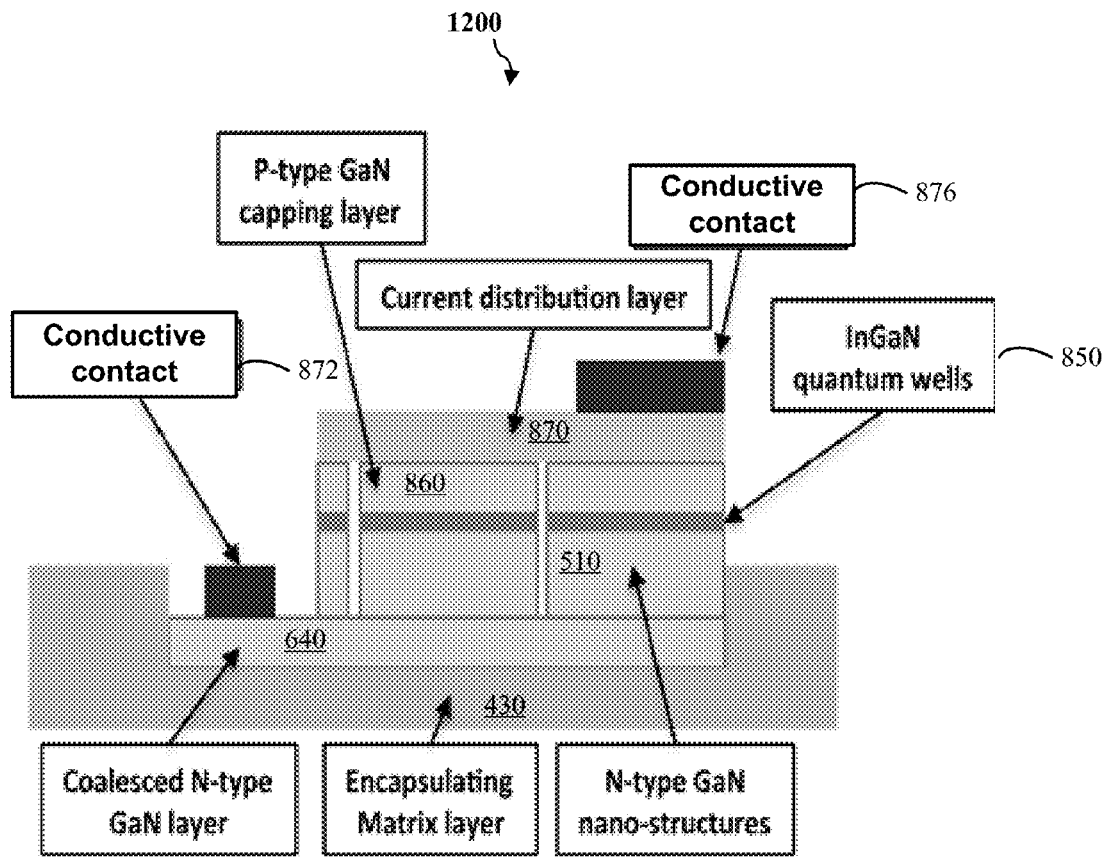
FIG. 12 depicts conductive contacts formed on N-type coalesced side of the light emitter in one configuration that allows for the electrical injection to take place from the same side of the light emitter structure according to an aspect of the present disclosure.
Figure 18:
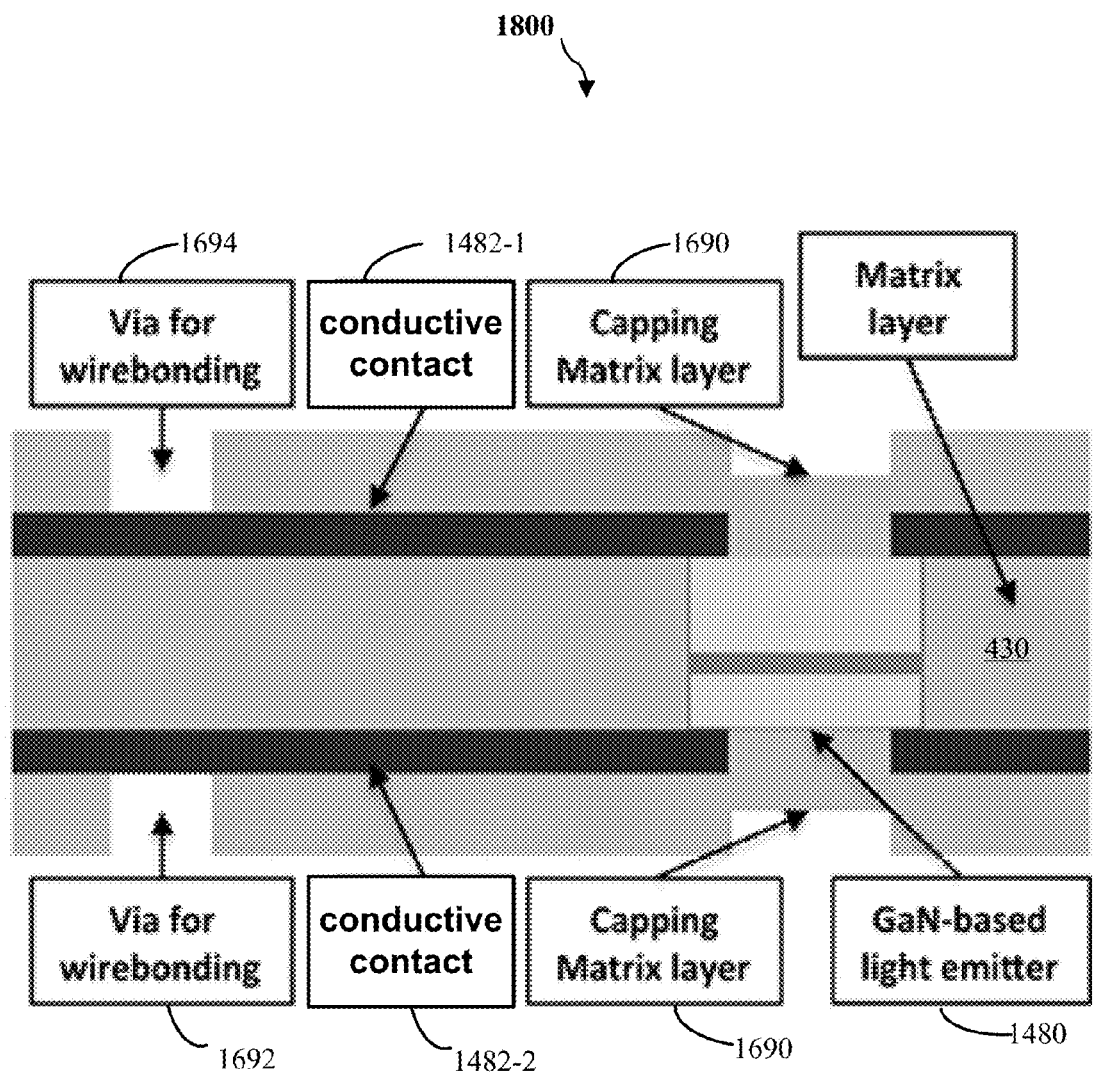
FIG. 18 depicts metal contacts deposited and capped by the matrix layer (e.g., $SiN_x$) according to an aspect of the present disclosure.

FIGS. 11, 12, and 18 show three exemplary configurations based on semiconductor nanostructure sheets. These figures depict various configurations of a thin light emitter that embeds nanostructure LEDs using nanostructure semiconductor sheets. The nanostructure LEDs are embedded in a thin matrix of transparent material such as $SiN_x$, $SiO_2$, or any other material that is transparent at the wavelength of emission from embedded nanostructure LEDs and is mechanically robust under growth conditions used in fabrication of semiconductor nanostructures. The thickness of this light emitter may be controlled by the thickness of the embedding matrix, as the thickness of the nanostructure LED is much smaller (typically few hundred nanometers).

In one configuration, quantum wells are grown on the m-plane surfaces of GaN nanostructure sheets, which provide confinement of carriers along a crystallographic direction that does not possess piezoelectric fields. Note that choosing to grow the quantum wells on m-plane surfaces is only exemplary and should not be considered as a limiting factor to the present disclosure. One aspect of the present disclosure enables growth and manufacture of m-plane substrates based on group III-nitride nanostructures that are embedded in a matrix (e.g., $SiN_x$ or $SiO_2$).

Figure 2:
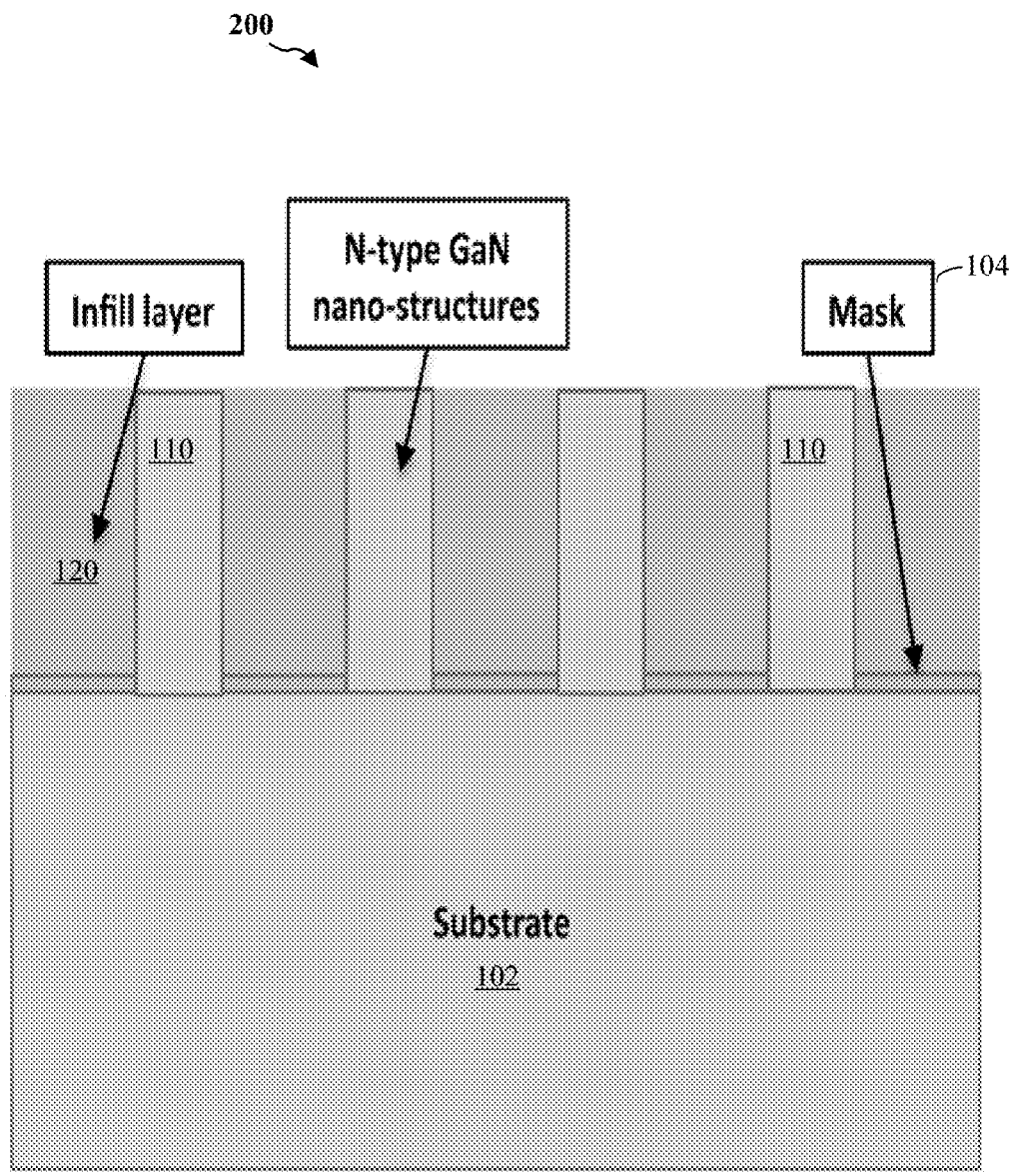
FIG. 2 is a block diagram depicting nanostructures grown on the substrate that are embedded in an infill layer according to an aspect of the present disclosure.

FIG. 2 is a block diagram showing semiconductor nanostructures 110 grown on the first host substrate 102 that are embedded in an infill layer 120 according to an aspect of the present disclosure. After growing the semiconductor nanostructures 110 (e.g., GaN nanostructures), in this configuration, the semiconductor nanostructures 110 are spin coated by hydrogen silsesquioxane (HSQ) until completely encapsulated by the infill layer 120 (e.g., HSQ), as shown in FIG. 2.

Figure 3:
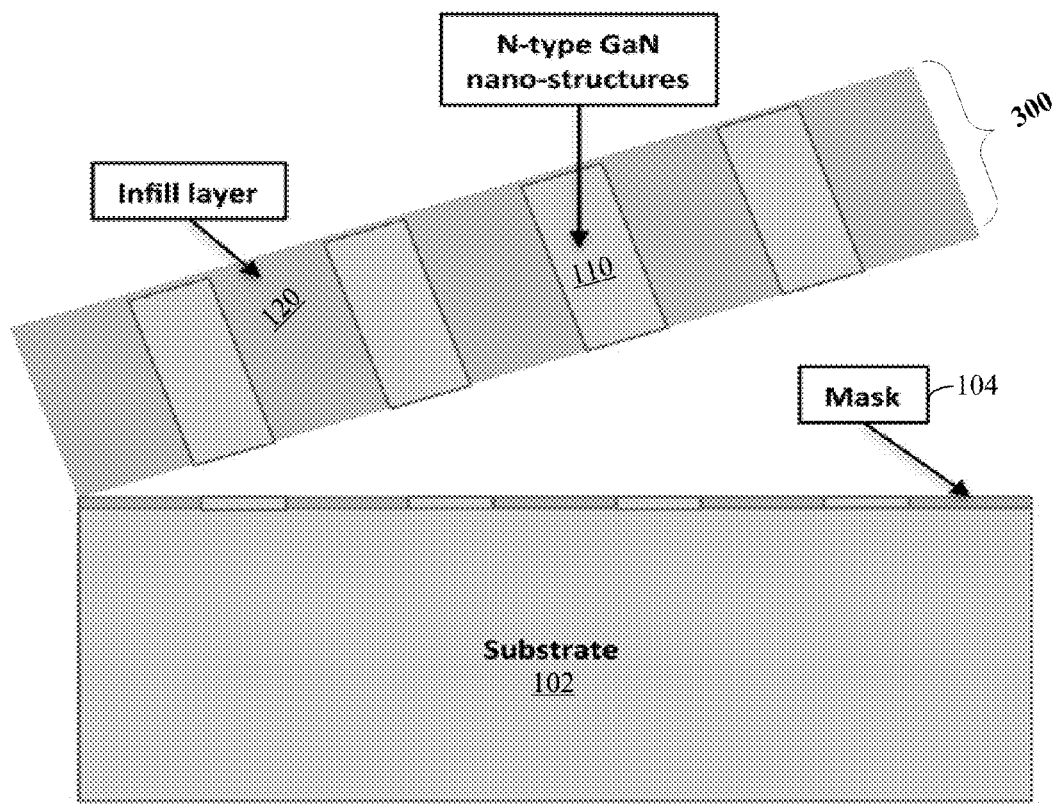
FIG. 3 is a block diagram depicting a sheet including semiconductor nanostructures embedded in an infill layer after being mechanically removed from the substrate according to an aspect of the present disclosure.

FIG. 3 is a block diagram depicting a sheet 300 including semiconductor nanostructures 110 embedded in the infill layer 120 after being mechanically removed from the first host substrate 102 according to an aspect of the present disclosure. In this configuration, the sheet 300 is mechanically detached by scraping. Other techniques such as laser lift-off (LLO) or chemical lift-off (CLO) can be used to release the substrate to separate the sheet 300 from the first host substrate 102. The semiconductor nanostructures 110 can also be removed by shearing them off of the first host substrate 102 to transfer the nanostructure sheets to the new matrix.

Figures 4A, 4B:
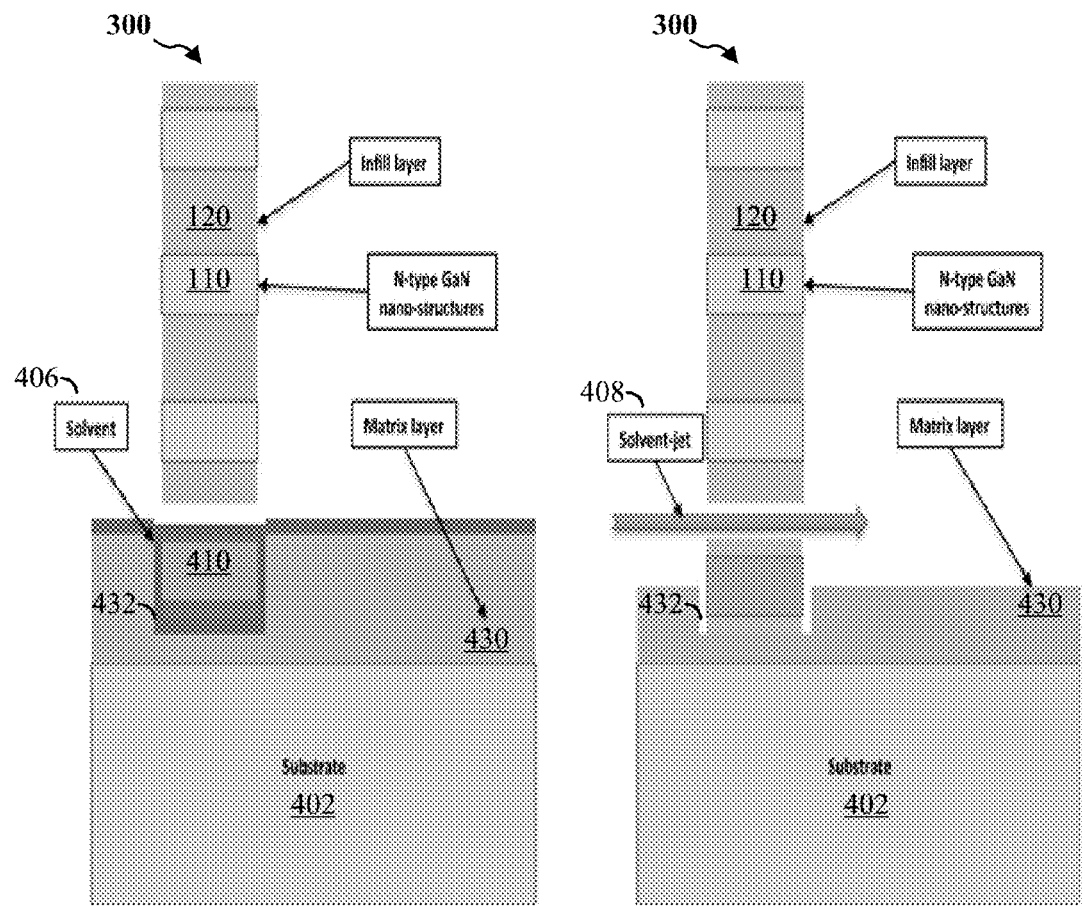
FIGS. 4A and 4B depict removal and placement of semiconductor nanostructures from the sheets into a matrix layer according to an aspect of the present disclosure.

FIGS. 4A and 4B depict removal and placement of semiconductor nanostructures 410 from the sheet 300 into a matrix layer 430 according to an aspect of the present disclosure. In this aspect of the disclosure, each of the semiconductor nanostructures 410 is individually removed from the sheet 300 once exposed to a suitable solvent bath 406 or exposed to a solvent jet 408 ("the solvent"), as shown in FIGS. 4A and 4B. Examples of such solvents include $NaCl_2$/NaOH and MIBK if the infill layer is HSQ. In this manner, individual ones of the semiconductor nanostructures 410 are placed within designated positions 432 that have been previously created in a suitable material layer on another substrate ("the matrix layer"), such as $SiN_x$.

In FIGS. 4A and 4B the thickness of the matrix layer 430 may be anywhere between 1 μm to 50 μm and should not be considered a limiting factor to the aspects of the present disclosure. Depending on the thickness and optical properties of the matrix layer 430, it may be fabricated using the techniques and materials noted above.

For example, an optically transparent matrix layer (e.g., $SiN_x$) can be deposited using LPCVD or an HSQ layer may be spun on the second host substrate 402. In one configuration, HSQ is first spun on the second host substrate 402 and then this HSQ layer is converted into a $SiO_2$-like layer after thermal treatment with excellent optical properties in the visible spectrum. This SiO$_2$-like layer mentioned above now constitutes the matrix layer 430. The matrix layer 430 is then processed by patterning and etching to define designated positions 432 (e.g., boxes) into the matrix layer 430. The depth of the designated positions 432 may depend on the type of geometry used and will be different from one application to the other. The lateral dimension of these designated positions 432 may depend on the overall geometry and design of the light emitting structure.

In one configuration, the size of the designated positions 432 formed in the matrix layer 430 is increased to contain an increased number of semiconductor nanostructures 410. For example, designated positions 432 of 100 µm×100 µm would contain 10000 1 µm×1 µm ones of the semiconductor nanostructures 410. In another configuration, there may only be one semiconductor nanostructure or a few semiconductor nanostructures 410 per each of the designated positions 432. While larger ones of the designated positions 432 may provide higher brightness cells, the smaller cells make it possible to build very high resolution displays and eliminate current distribution layers, including but not limited to ITO layers, thereby reducing the cost of the finished product.

As noted above, the semiconductor nanostructures 110 may be encapsulated inside an infill layer 120 and then removed from the first host substrate 102. In this configuration, the sheet 300 containing the semiconductor nanostructures 110 is then rotated by 90 degrees such that semiconductor nanostructures 110 lay horizontally with the 1 µm×1 µm edge facing the designated positions 432 in the matrix layer 430.

The semiconductor nanostructures 410 of the sheet 300 are then released into the designated positions 432 (e.g., boxes) by either resolving the encapsulating HSQ inside the solvent-filled boxes or by using a commercial or home-made liquid-jet system to release the individual nanostructure sheets into the designated positions 432. This can be seen in FIGS. 4A and 4B.

Figure 5:
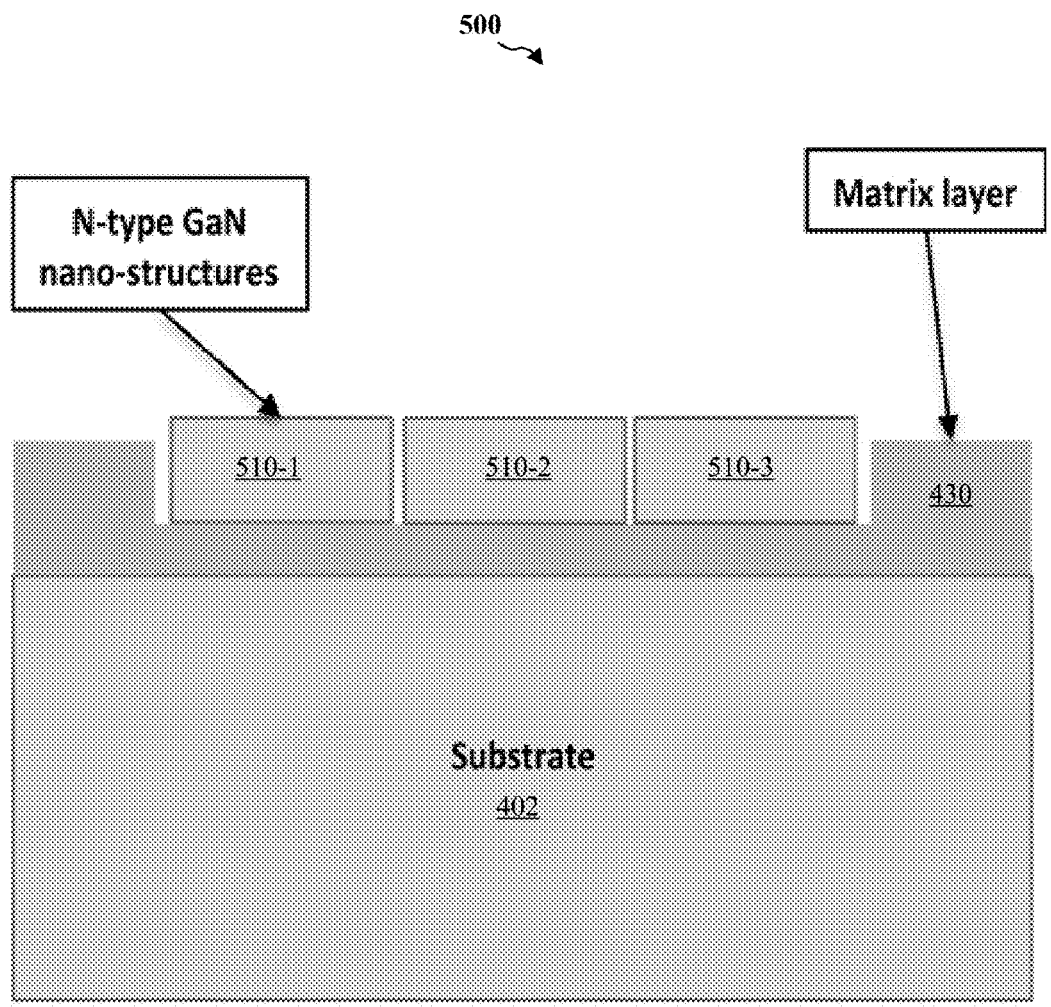
FIG. 5 depicts N-type GaN nanostructures, inside their designated positions, further rinsed and cleaned according to an aspect of the present disclosure.

FIG. 5 is a block diagram 500 depicting an arrangement of semiconductor nanostructures 510 (e.g., N-type GaN nanostructures) arranged within the matrix layer 430 in a display orientation after being further rinsed and cleaned according to an aspect of the present disclosure. For example when the solvent is NaCl$_2$/NaOH, water can be used for cleaning and can be dried and evaporated afterwards using standard processing techniques. In this configuration, as HSQ is dissolved in salt-based solvents such as NaCl$_2$/NaOH further rinsing by water completely removes any HSQ left on the nanostructure sheets, as can be seen in FIG. 5, leaving the nanostructures in the designated positions 432. The water then can be evaporated by standard hot-plate treatment. The choice of HSQ is not unique here and other polymers can be used. For example, Poly Methyl Methacrylate (PMMA) can be used as the encapsulating layer described here, in which case the solvent and rinse for further processing will be Acetone and isopropyl alcohol (IPA) respectively (Acetone+Methanol+Water can also be used).

Figure 6:
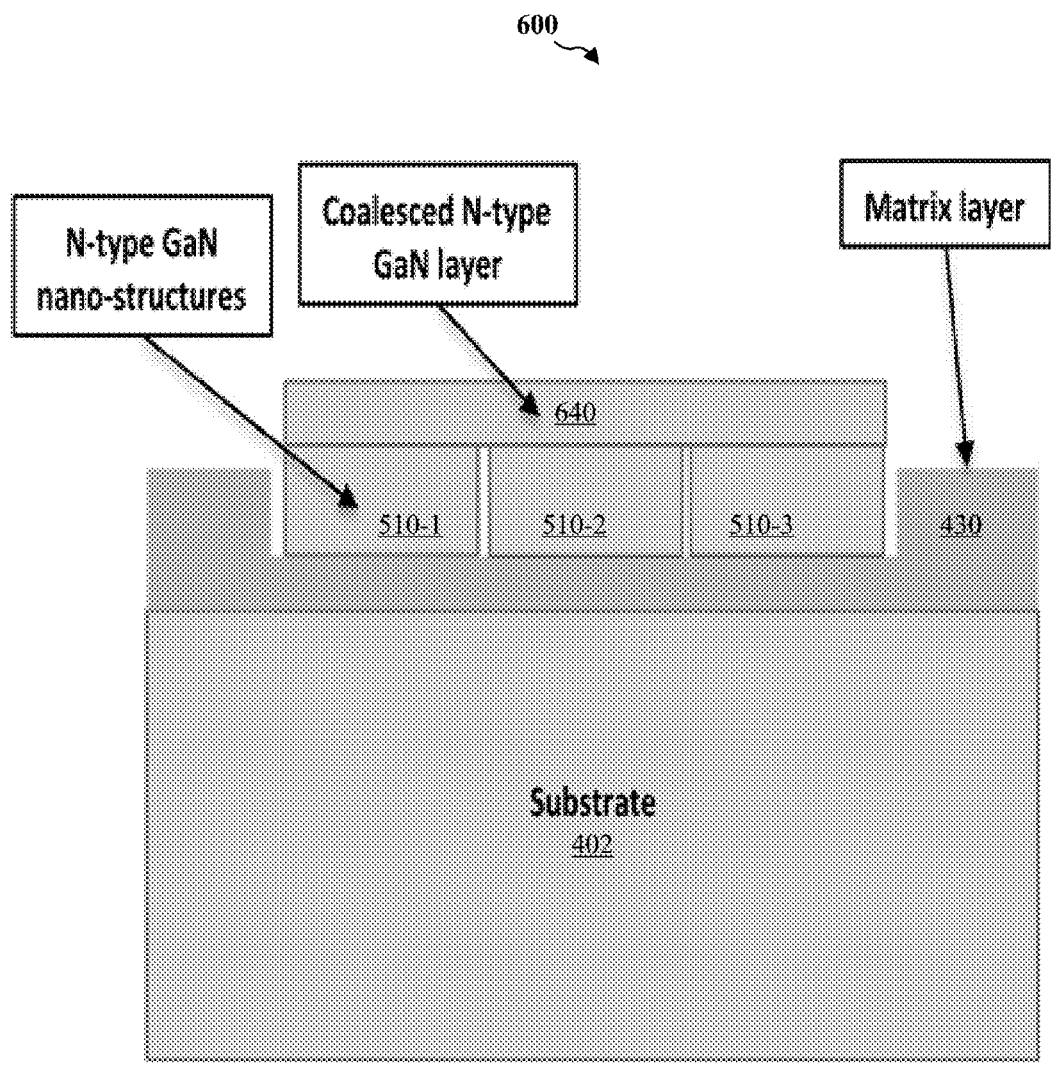
FIG. 6 depicts semiconductor nanostructure sheets with a coalescent layer according to an aspect of the present disclosure.

FIG. 6 is a block diagram 600 depicting the semiconductor nanostructures 510 of FIG. 5, including a coalescent layer 650 according to an aspect of the present disclosure. In this configuration, the semiconductor nanostructures 510 (e.g., N-type GaN nanostructures) are coalesced to form a thin m-plane film (e.g., N-type m-plane GaN film) as the coalescent layer 650. In this aspect of the present disclosure, an m-plane substrate (e.g., the coalescent layer 650) can be grown out of high quality m-plane facets of underlying coalesced semiconductor nanostructures. This substrate later can be used for variety of purposes and applications. In one configuration, an N-type nature of the coalesced layer is application dependent and is specific to this configuration. In addition, doping levels can be controlled and are independent of the overall strategy to build the noted substrate.

Figure 7:
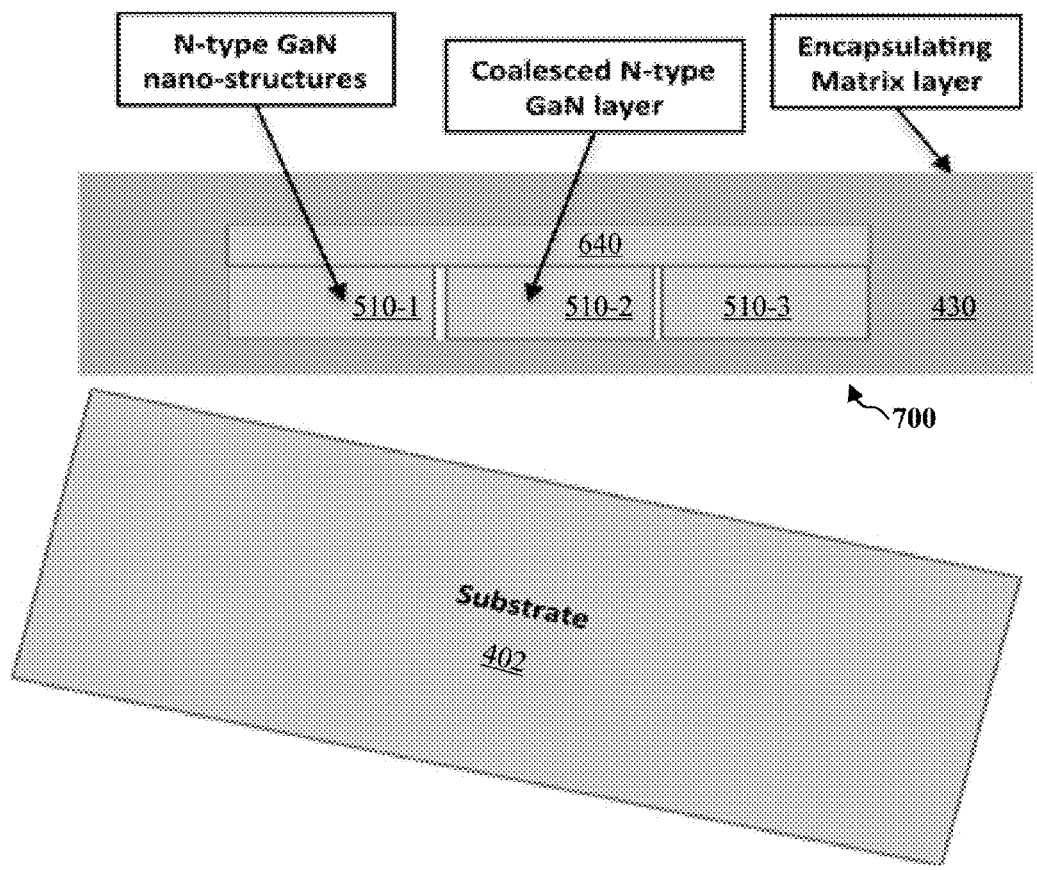
FIG. 7 depicts coalesced and encapsulated nanostructure sheets that are once again removed from substrate according to an aspect of the present disclosure.

FIG. 7 depicts a coalesced and encapsulated nanostructure sheet 700 that is removed from the second host substrate 402 according to an aspect of the present disclosure. This release of the second host substrate 402 is trivial as there are no crystalline links between the semiconductor nanostructures 510 and the second host substrate 402. As a result, the second host substrate 402 can be released by wet etching. Other standard substrate-releasing techniques may also be applied. Representatively, after coalescing the semiconductor nanostructures 510, they are encapsulated in the material of the matrix layer 430 (e.g., SiN$_x$) and the second host substrate 402 is released by the standard techniques noted above.

Figure 8:
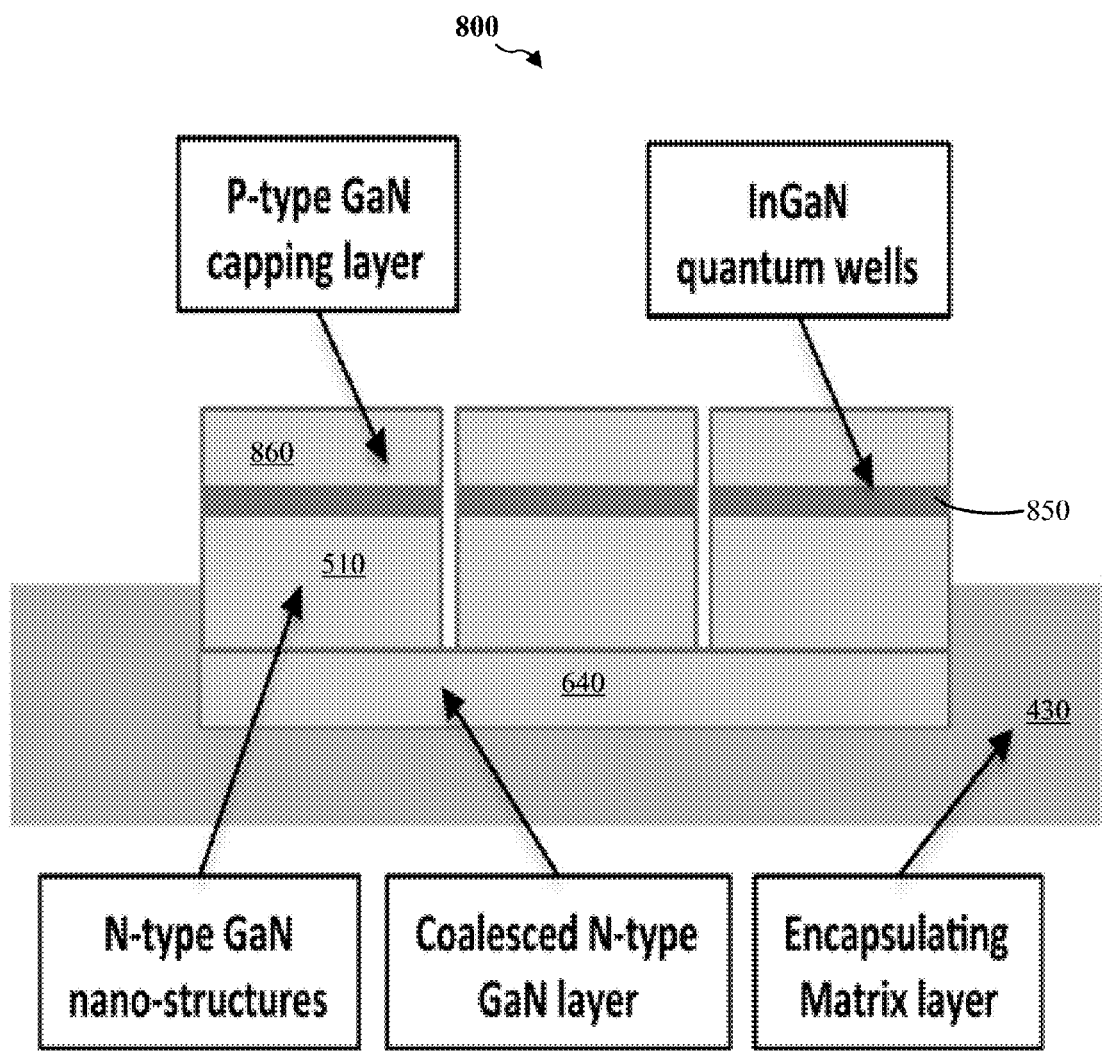
FIG. 8 depicts coalesced and encapsulated nanostructure sheets that are flipped over with further processing to expose the N-type sheets where quantum well and P-type capping layers are grown atop the N-type sheets according to an aspect of the present disclosure.

FIG. 8 is a block diagram 800 depicting the coalesced and encapsulated nanostructure sheet 700 of FIG. 7 after being flipped over with further processing to expose the semiconductor nanostructures 510 according to an aspect of the present disclosure. In this configuration, the well layer 850 (e.g., InGaN quantum well layer) is then grown and capped by a capping layer 860 (e.g., a P-type GaN capping layer). For example, a crystal layer is grown on individual ones of the of semiconductor nanostructures 510 to form the well layer 850. This process may further include forming optical cavities and/or optical waveguides. This process may also include fabricating an integrated optical circuit using photonic crystal effects.

Figure 9:
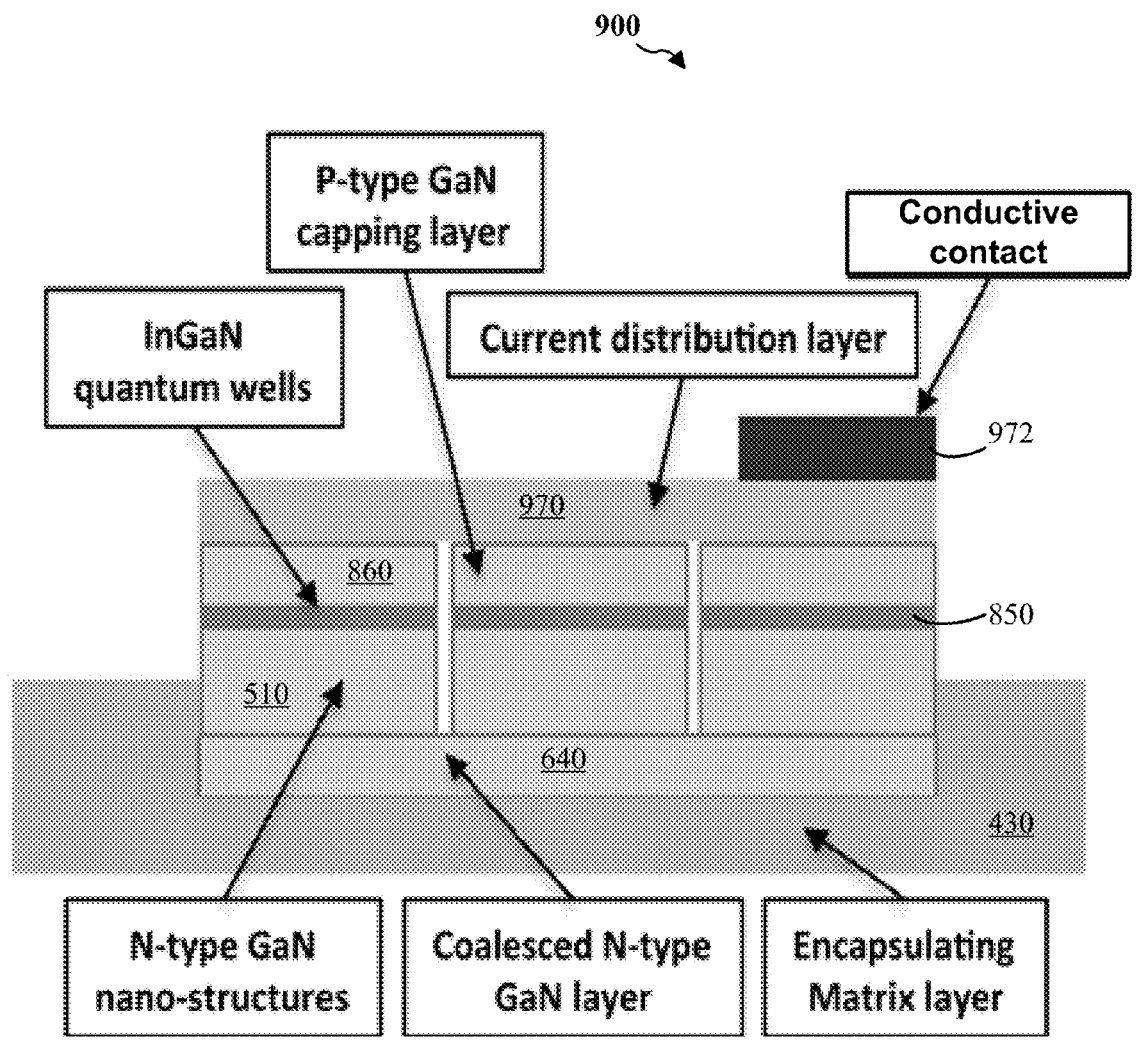
FIG. 9 depicts a conformal current distribution layer and conductive contacts deposited for electrical injection according to an aspect of the present disclosure.

FIG. 9 is a block diagram 900 depicting a conformal current distribution layer 970 and a conductive contact 972 deposited for electrical injection according to an aspect of the present disclosure. In one configuration, a conformal ITO layer and an ohmic electrical contact are deposited for current injection. At this stage the structure, depending on the application, is covered by a matrix layer 430 of SiN$_x$, SiO$_2$, or one of the above noted materials that is suitable for the matrix layer, Polydimethylsiloxane (PDMS), or other forms of polymers including but not limited to polyimide, PMMA, or cyclotene.

Figure 10:
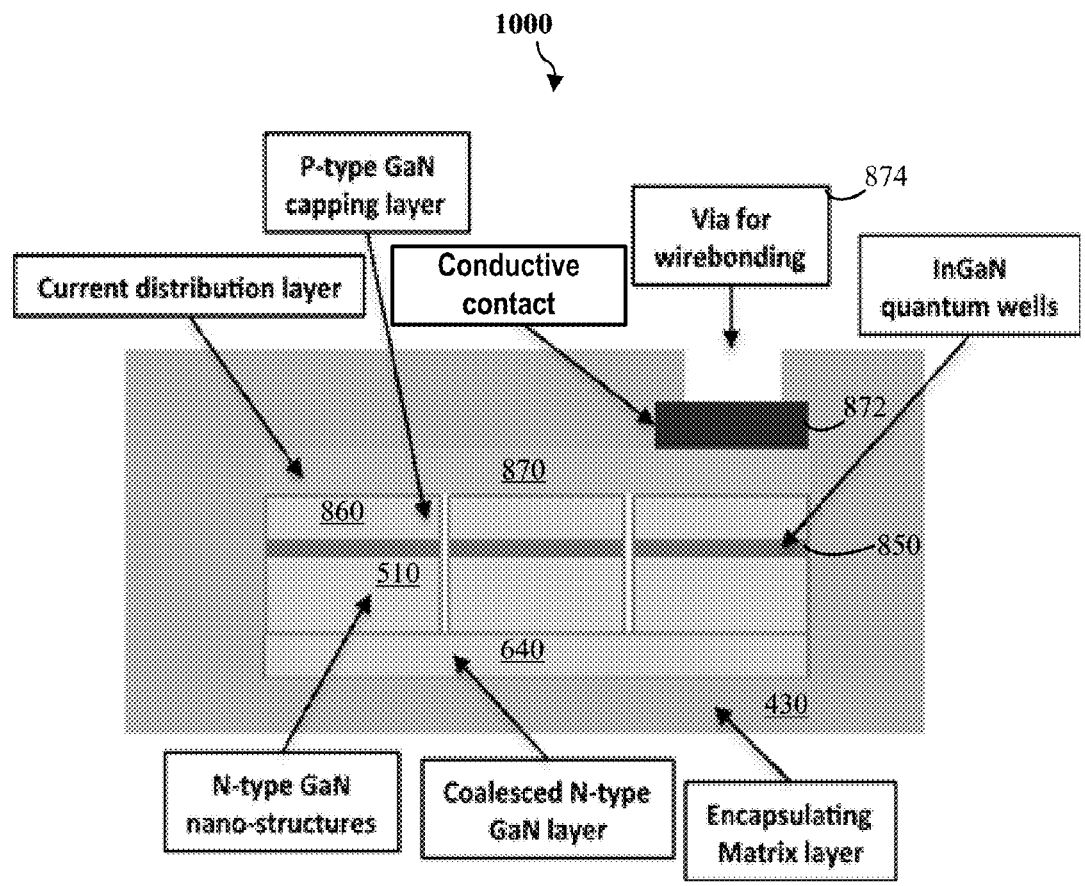
FIG. 10 depicts the light emitter encapsulated in the matrix layer (i.e., $SiN_x$ or $SiO_2$) with electrical vias for wire-bonding according to an aspect of the present disclosure.

FIG. 10 is a block diagram depicting a light emitter structure 1000 encapsulated in a matrix layer 430 with electrical vias 874 for wire-bonding according to an aspect of the present disclosure. In this arrangement, an opening in the matrix layer exposes the conductive contact 872. In addition, FIG. 11 depicts an arraignment of the conductive contact 872 and the conductive contact 876 on a coalesced side of the light emitting structure 1100 alongside with electrical vias 874 for wire-bonding according to an aspect of the present disclosure. A conductive contact 876 is then created on the coalescent layer 640 after further processing (patterning, etching, and conductive contact deposition). Electrical vias 874 are opened to electrically address the light emitter structure 1000/1100, as shown in FIGS. 10 and 11. The location and exact size of the conductive contact 872 and the conductive contact 876 may be chosen differently from the exemplary design shown in FIG. 11 without departing from the main scope of the present disclosure.

FIG. 12 depicts a light emitter structure 1200 in which a conductive contact is formed on an N-type coalesced side of the light emitter structure 1200. This configuration allows electrical injection to take place from the same side of the light emitter structure 1200 according to an aspect of the present disclosure. In this configuration, the light emitter structure 1200 can be fabricated by patterning, etching, and conductive contact formation.

In one method of the present disclosure, as can be seen in FIGS. 11 and 12, the light emitter structure 1200 includes a matrix layer 430 that is composed of a dielectric layer that is a few micrometers thick. This matrix layer can be SiON or other dielectrics including but not limited to $SiN_x$ or $SiO_2$. The light emitter then can be used in variety of forms to achieve a certain goal. For example, $SiN_x$, when bonded to polyimide via PDMS, show very good elasticity. This provides the opportunity for manufacture of thin, stretchable, and flexible light emitters by having the $SiN_x$ islands that embed nanostructure LEDs, as described in previous paragraphs, be bonded on another flexible substrate by an intermediary substance.

One exemplary method is to directly bond the $SiN_x$ side of the light emitter seen in FIG. 11 and FIG. 12 to a polyimide substrate via PDMS. In another exemplary method it is possible to cap the light emitter seen in FIG. 9 with PDMS and directly bond to a polyimide substrate after flipping the structure. The contact formation on the N-type coalesced layer then can be achieved by, as mentioned before, standard processing (patterning, etching, and metal deposition) techniques.

The technology presented here provides the possibility of manufacturing high-resolution, high-brightness, and low-cost displays by creating the possibility of electrically addressing one or more of nanostructure-sheet LEDs. As these tiny LEDs incorporate light emission from m-plane facets they are also expected to be more efficient compared to their c-plane counterparts as mentioned before. On the other hand the nanostructures used for fabrication of these LEDs are of higher quality as the defect density is expected to be much smaller (also reported in the literature), which adds to efficiency of the light emitter proposed in our invention. As the nanostructure sheets only occupy a small surface area they can be electrically addressed directly without a distribution layer including but not limited to ITO. To achieve this, the nanostructure sheets are released into previously defined boxes in the matrix (i.e., $SiN_x$), as seen in FIG. 4 and noted above. Note that if more than one nanostructure sheet is needed to form an LED the method of paragraphs noted above may be applied. The application of ITO may be relaxed if the lateral size of the coalesced layer can be small removing the need for a current distribution layer. Note that the composition of the metal layers for forming direct Ohmic contact to P-type GaN has been discussed in the literature and is applicable here. In the following paragraphs we describe another exemplary method where only one nanostructure sheet is placed in designated areas in the matrix.

Figure 13:
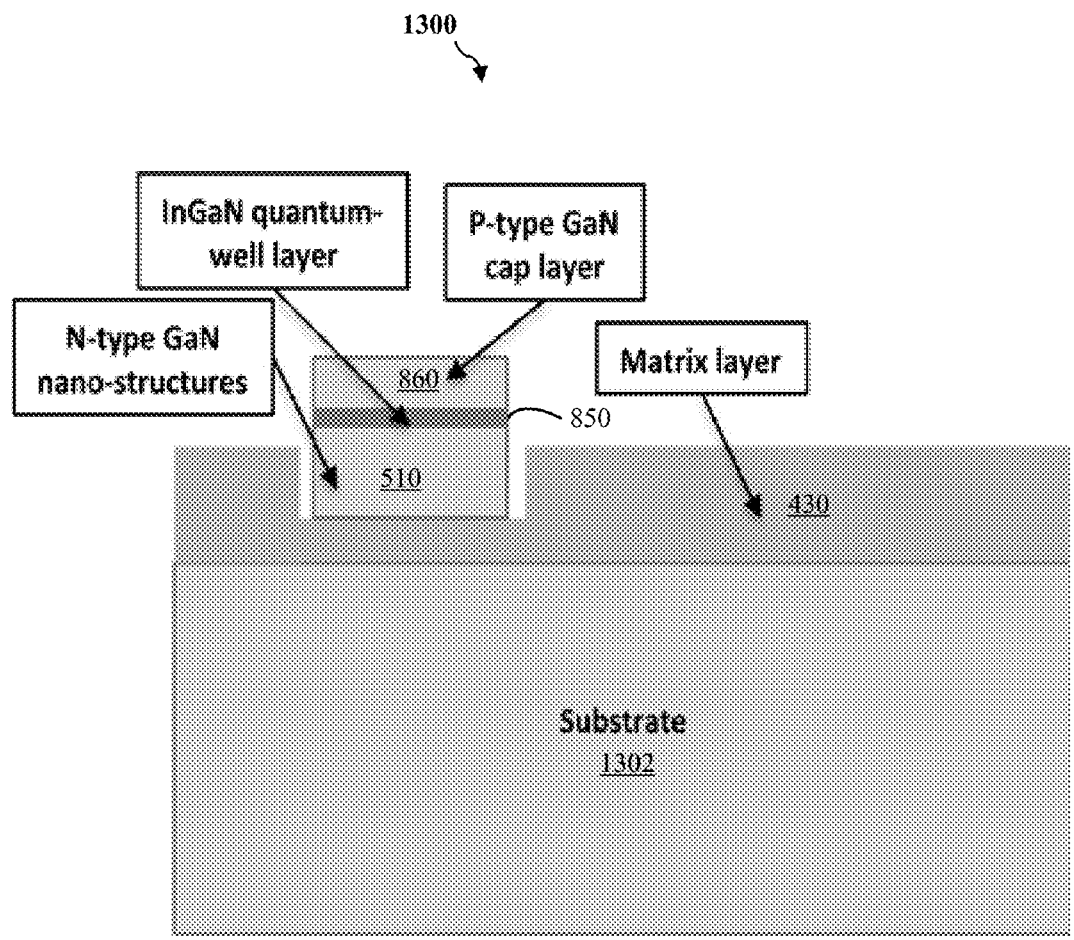
FIG. 13 depicts InGaN quantum wells grown on m-plane faces of the nanostructures that are capped with a p-type GaN layer after the transfer to another substrate according to an aspect of the present disclosure.

FIG. 13 is a block diagram 1300 depicting an arrangement of a well layer 850 (e.g., InGaN quantum well layer) grown on m-plane faces of the semiconductor nanostructures 510 that are capped with a capping layer 860 (e.g., p-type GaN) according to an aspect of the present disclosure. As noted above, the nanostructure sheets are placed in designated positions in the matrix layer 430 and further rinsed by water. The well layer 850 is then grown on the semiconductor nanostructures 510 and capped by a P-type GaN layer. The result of these steps can be seen in FIG. 13. As noted before, and according to one aspect of this disclosure, the nanostructures maybe sheets. In this way, when positioned horizontally, with the larger face laying on the matrix layer 430 after the transfer more real state can be achieved. This also allows for better current injection and distribution.

Figure 14:
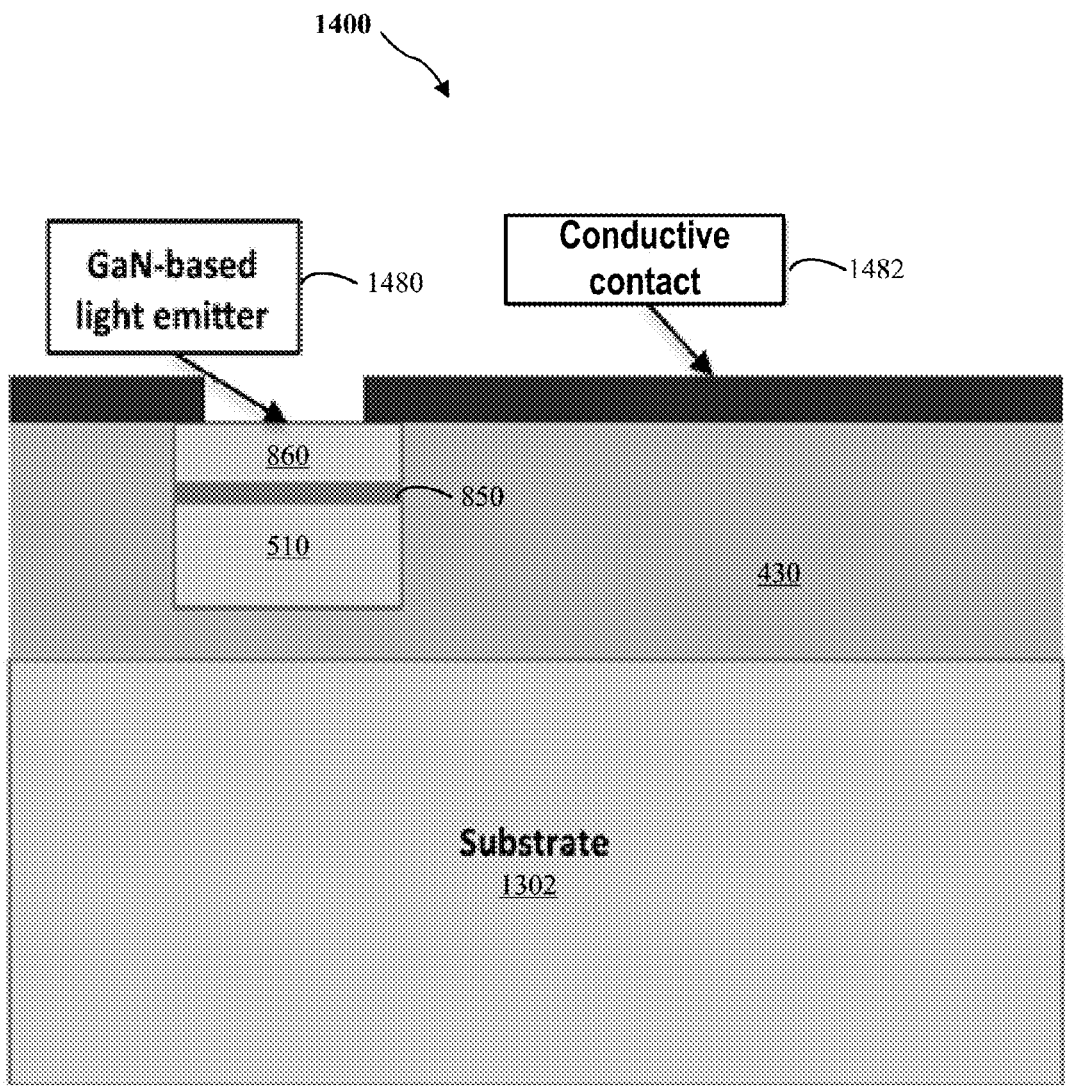
FIG. 14 depicts the combination of N-type GaN-nanostructures, the quantum well layers, and the p-type capping layer and a contact layer according to an aspect of the present disclosure.
Figure 15:
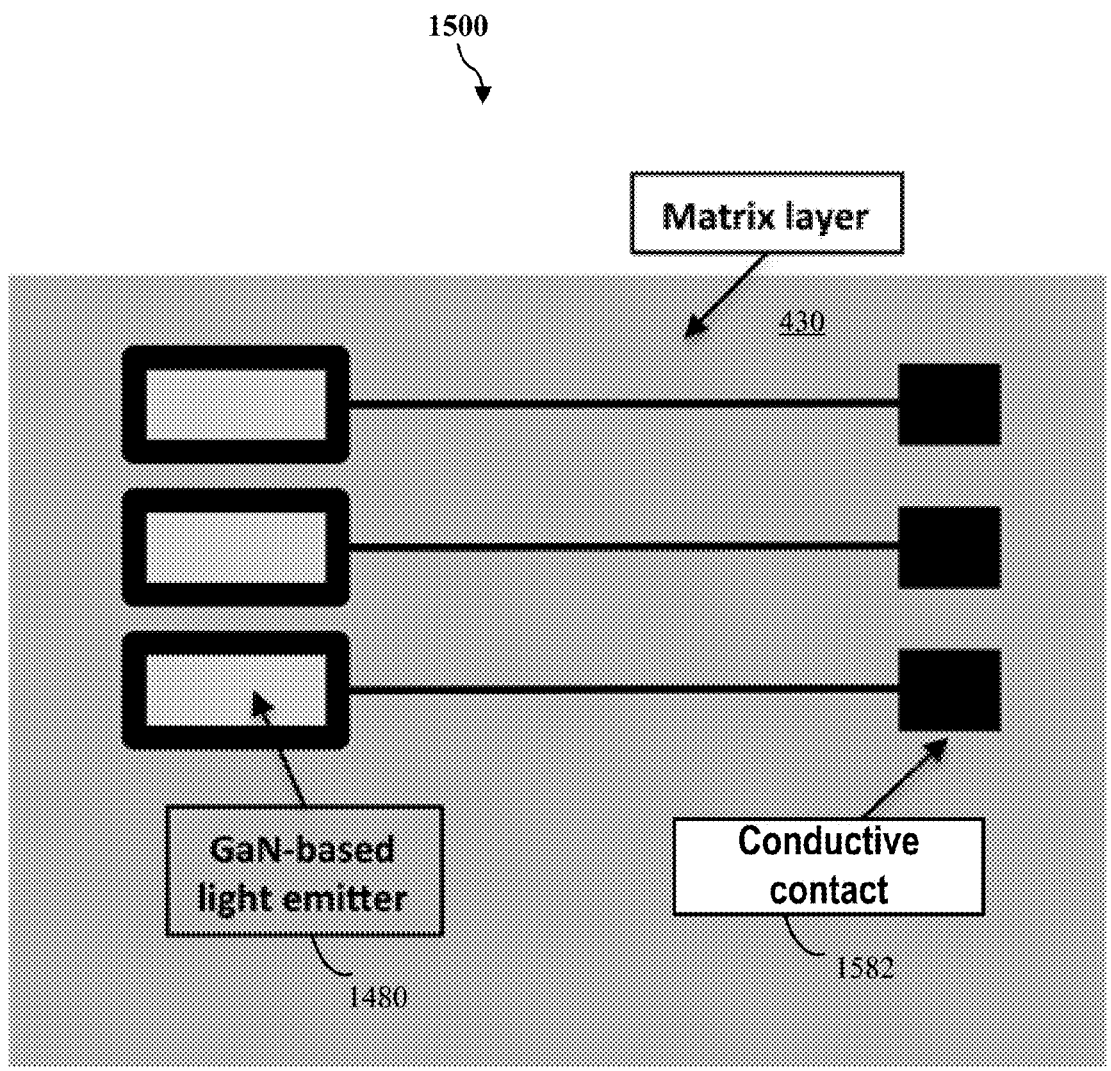
FIG. 15 depicts a top view of the light emitting structure after forming metal contacts to the top p-type GaN capping layer according to an aspect of the present disclosure.

FIG. 14 depicts a light emitter structure 1400 that combines the semiconductor nanostructures 510, the well layer 850, and the capping layer 860 to form a nanostructure-based light emitter 1480 (e.g., a light emitting diode) according to an aspect of the present disclosure. This nanostructure-based light emitter 1480 is then capped with the matrix layer 430 (e.g., $SiN_x$ or $SiO_2$) and further processed to form the conductive contact 1482 on the matrix layer 430 and the capping layer 860. In addition, FIG. 15 depicts a top view 1500 of the light emitting structure after forming of the conductive contact 1482 to the capping layer according to an aspect of the present disclosure. For example, individual ones of the nanostructure-based light emitter 1480 can be electrically address this way eliminating the need for a current distribution layer such as ITO. Nevertheless, an intermediary current distribution layer covering the nanostructure-based light emitter 1480 may be incorporated if need be. The conductive contact 1482 is then made into the current distribution layer.

Figure 16:
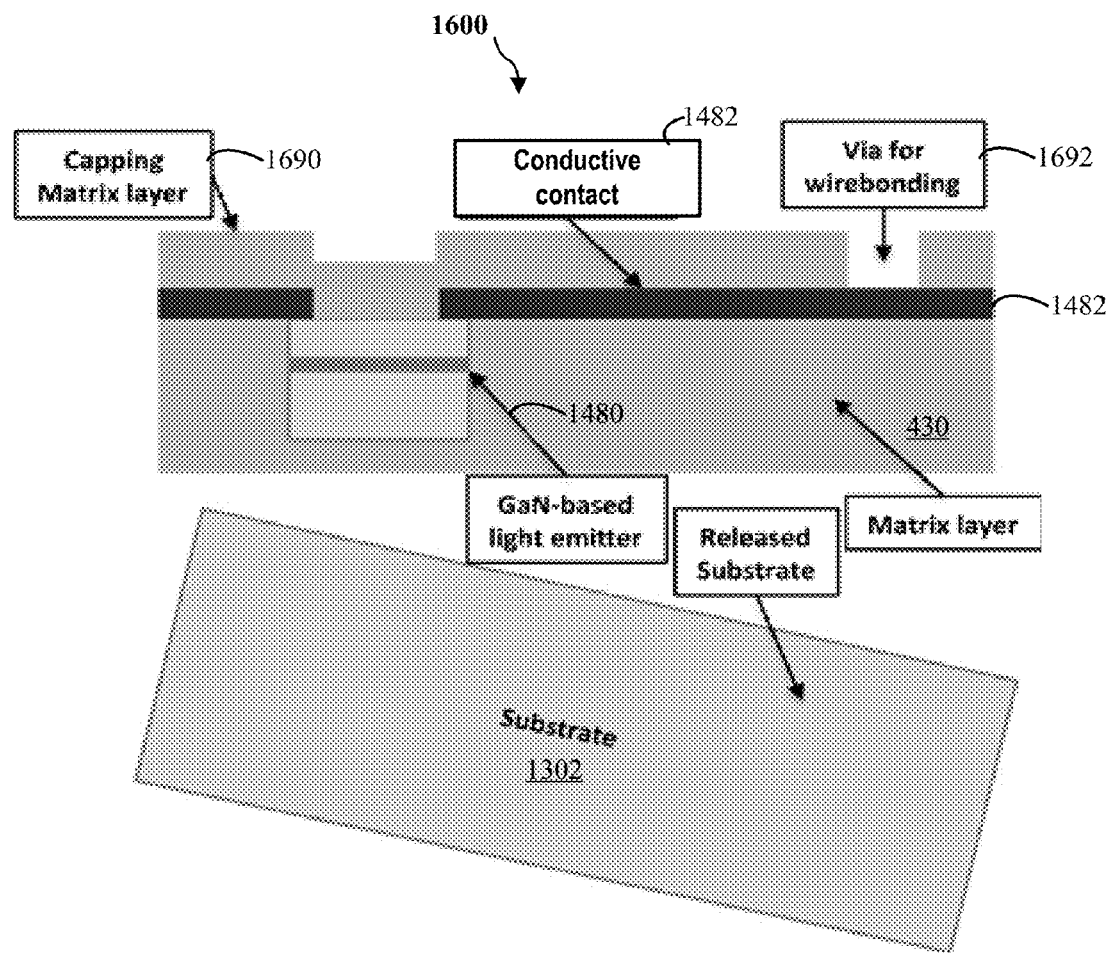
FIG. 16 depicts the conductive contacts that are covered by the matrix layer according to an aspect of the present disclosure. The GaN substrate is released leaving only the matrix layer according to an aspect of the present disclosure.

FIG. 16 depicts a block diagram 1600 illustrating an arrangement of the conductive contact 1482 that is covered by a capping matrix layer 1690 according to an aspect of the present disclosure. Representatively, the third host substrate 1302, which is not the substrate the nanostructures were originally grown upon, is released leaving only the matrix layer 430 according to an aspect of the present disclosure. As can be seen in FIGS. 14 and 15, the P-type GaN face of the LED can now, as noted above, be directly electrically contacted by conductive material (e.g., metal) deposition. The light emitting structure is then encapsulated by further matrix layer deposition and a third host substrate 1302, similar to the description noted above, is released. This can be seen in FIG. 16. As described above, the choice of $SiN_x$ for encapsulation at this point is not unique and may be replaced by PDMS or other types of transparent material depending on the application.

In this configuration, conductive contacts are deposited on the N-type facets of the nanostructure-based light emitter 1480 after being flipping over and exposing, for example, an N-type GaN face of a nanostructure LED. The structure is then encapsulated in SiN, and electrical vias are opened for wire-bonding. These processes can be seen in FIG. 17 and FIG. 18.

Figure 17:
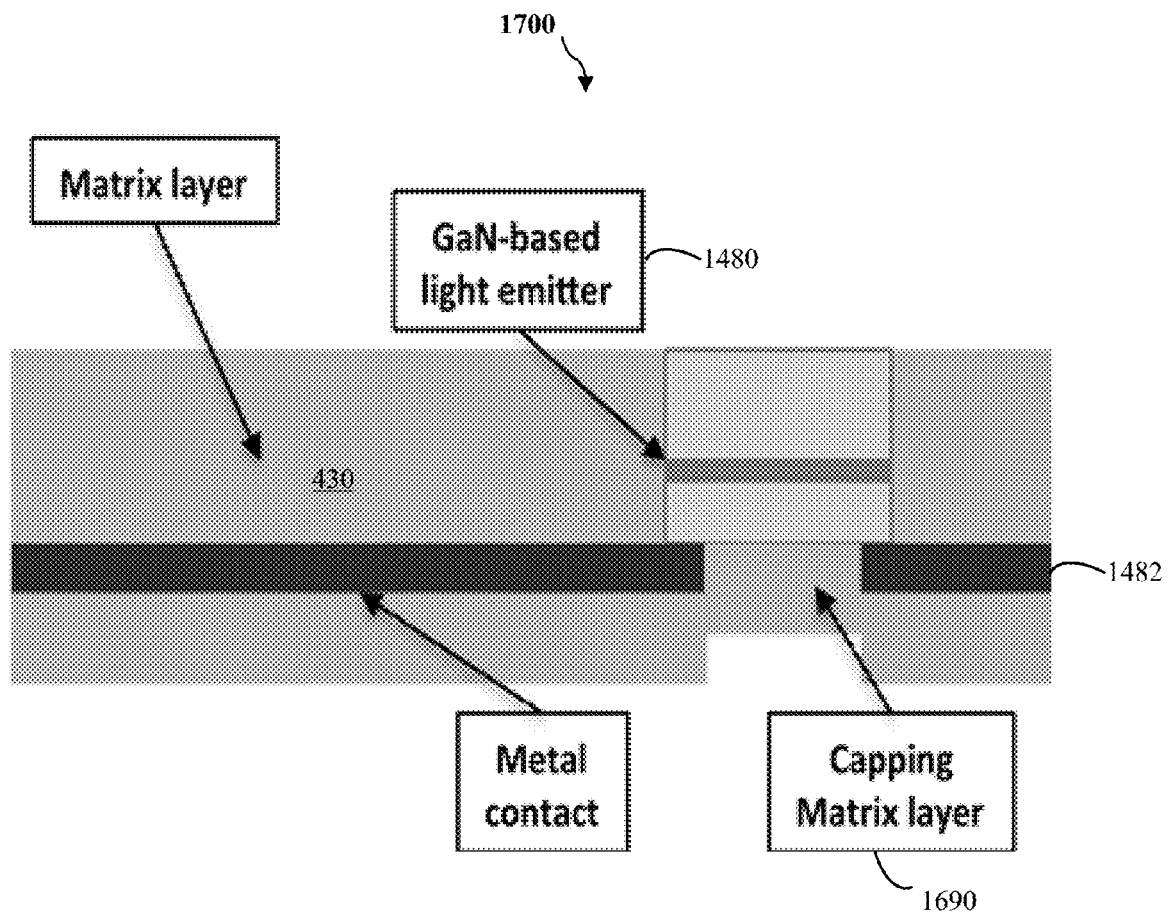
FIG. 17 depicts the matrix layer containing the GaN-based light emitters that is flipped over and further processed to expose the N-type GaN side of the light emitter according to an aspect of the present disclosure.

FIG. 17 is a block diagram 1700 depicting the matrix layer 430 containing the nanostructure-based light emitter 1480 that is flipped over and further processed to expose, for example, the N-type GaN side of the nanostructure-based light emitter 1480 according to an aspect of the present disclosure. In addition, FIG. 18 depicts an arrangement of the conductive contact 1482 deposited and capped by the capping matrix layer 1690 (e.g., $SiN_x$) according to an aspect of the present disclosure. After creating electrical vias 1692 and 1694, by further lithography and wire-bonding, an electrically addressable light emitter 1800 is created that is very thin and utilizes high quality GaN nanostructures for light emission.

Figure 19:
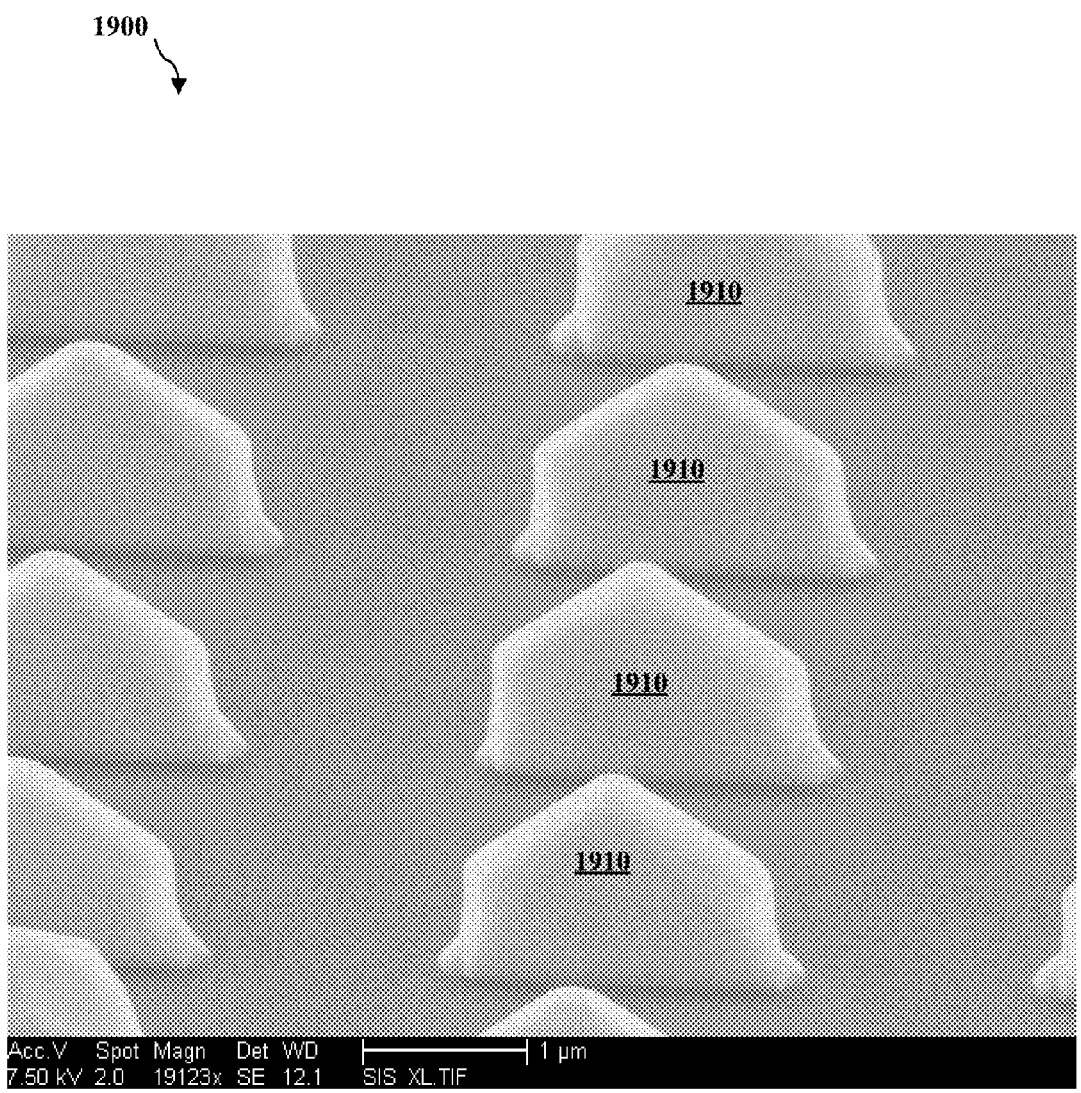
FIG. 19 is a scanning electron microscope (SEM) image of fabricated (e.g., grown) GaN nanostructures as exemplary semiconductor nanostructures according to aspects of the disclosure.

FIG. 19 is a scanning electron microscope (SEM) image 1900 of fabricated (e.g., grown) GaN nanostructures as exemplary semiconductor nanostructures according to aspects of the disclosure. In FIG. 19, semiconductor nanostructures are depicted GaN nanostructures 1910 that have been grown using selective area growth by using, for example, a layer of $SiN_x$ as a mask layer (e.g., mask 104 of FIG. 1) on GaN templates where a few micron thick GaN on a c-plane aluminum oxide ($Al_2O_3$) layer is used as a substrate. The faces with pentagonal cross sectional area expose non-polar planes and become the display orientation, which is different than the original growth orientation (in this particular example perpendicular).

According to a further aspect of the present disclosure, a light emitting structure is disclosed. In one configuration, the light emitting structure includes a means for coupling molecular structures. The molecular structure coupling means may be the semiconductor nanostructures 110/410/510, as shown in FIGS. 1, 4 and 5. In another aspect, the aforementioned means may be any module or any apparatus configured to perform the functions recited by the aforementioned means.

It is worth mentioning that the method of transfer and embedding of the nanostructures described in this structure does not limit the type and composition of the nanostructures. For examples the nanostructures may comprise several layers of different materials forming one or more hetero-junctions. They may or may not be covered with metal, dielectric, or any other material layers. The only limitation here is for these materials to not dissolve in the liquid solvent used for removal of the individual nanostructures from encapsulating material, HSQ or PMMA for example, as was discussed above if the solvent is used to separate the nanostructures from the sheet 300.

It should be noted that according to one aspect of the technology described herein allows for orderly embedding of the above mentioned group III-nitride nanostructures in a lower index material such as $SiN_x$, or other materials of choice for the matrix layer as described above. This orderly embedding makes it possible to fabricate three-dimensional photonic crystals that can be used separately to achieve a certain optical effect by controlling the flow of light. For example several different layers of $SiN_x$ layers that already contain orderly arrangement of the nanostructures can be positioned on top of each other to achieve a three dimensional photonic crystal effect. This will have applications in wave guiding, optical cavities for lasers, etc. and is claimed as one of the achievements of the present disclosure.

According to one other aspect this disclosure, the nanostructures can be directly severed or broken off from their original substrate by mechanical force or other means. They can be transferred to another matrix layer 430 or another of the second host substrate 402 directly by a mechanical force, gravity, or any other means. This new structure where nanostructures individually or collectively reside in another environment other than the original one where they were grown is another aspect of this disclosure and will have applications in displays and general lighting.

The method and structure described above is a simplified way of fabricating photonic devices where the nanostructures act as light emitters or light absorbers for variety of applications. One such application is to disperse GaN nanostructure sheets with InGaN quantum well layers on a light guide, which is used for LCD backlighting. The nanostructures can be, in this way, optically excited giving off light at a desired wavelength. The excitation light source can be positioned at the edge of the light guide making this structure a very thin, efficient, edge-lit backlight for LCDs. According to another aspect of this disclosure the fully processed GaN nanostructures can be used for LCD backlighting or LED displays in a stand-alone manner by electrical injection.

The methods and structures described here can be extended to other material structures other than GaN such as III-nitrides, group III-V material systems, group II-VI material systems, group IV (i.e., silicon) materials with applications to high power electronics, ultrafast electronics, electrical-optical systems, light-on-a-chip systems, communication systems, terahertz applications, radio frequency and microwave applications, solar cells, sensors, transducers, imaging, and other semiconductor-based applications.

This technology involves the transfer of miniature GaN (or other semiconductor) nanostructures from their host substrate to a new medium referred here as the matrix layer. Examples of this matrix material are $SiN_x$, $SiO_2$, or another dielectric with proper optical properties mentioned above. The nanostructures, grown on their host substrate in a growth orientation, are expected to be of much higher quality than standard thin films epitaxially grown on buffer layers. Furthermore they can be engineered to expose a predetermined crystallographic plane. These nanostructures when removed from their host substrate and positioned in a display orientation (e.g., horizontally after rotating by 90 degrees) in the new matrix layer can be used as building blocks for variety of applications including light emission.

For example, N-type GaN nanostructure sheets maybe grown by selective are growth exposing a certain crystallographic plane. When severed from their host substrate and placed in a new matrix, InGaN quantum wells and P-type GaN layers can be formed atop the N-type nanostructures providing the possibility of creating tiny LEDs. These tiny LEDs, embedded in their new matrix, make it possible to from a highly efficient light emitting structure that is very thin. Furthermore, after the transfer of the nanostructures to the new matrix they can be coalesced to form a new high quality and economically viable non-polar plane, semi-polar plane, or polar plane substrates, which then can be used for variety of purposes including light emission.

Figure 20:
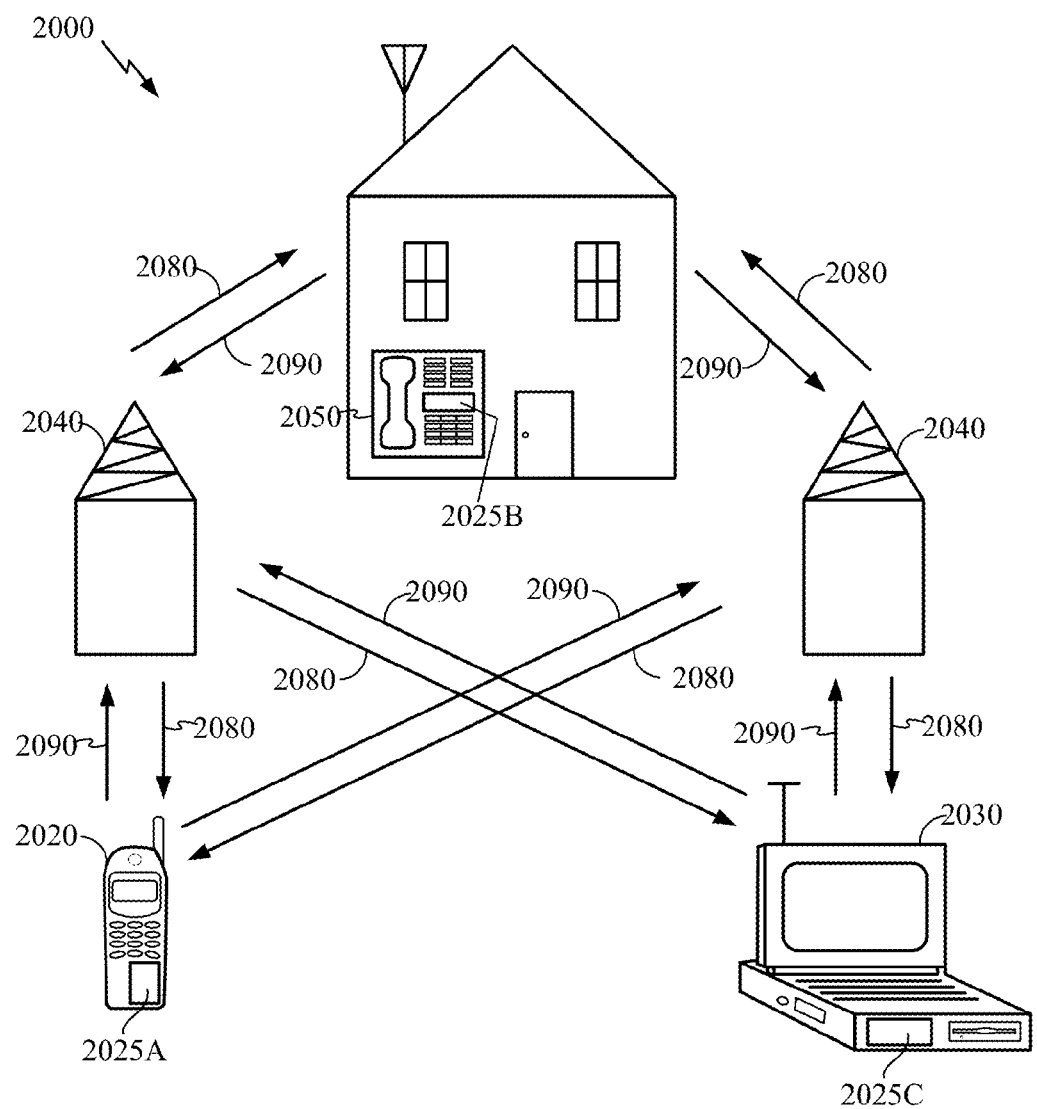
FIG. 20 is a block diagram showing an exemplary wireless communication system in which a configuration of the disclosure may be advantageously employed.

FIG. 20 is a block diagram showing an exemplary wireless communication system 2000 in which an aspect of the disclosure may be advantageously employed. For purposes of illustration, FIG. 20 shows three remote units 2020, 2030, and 2050 and two base stations 2040. It will be recognized that wireless communication systems may have many more remote units and base stations. Remote units 2020, 2030, and 2050 include IC devices 2025A, 2025C, and 2025B that include the disclosed light emitter structure. It will be recognized that other devices may also include the disclosed capacitors, such as the base stations, switching devices, and network equipment. FIG. 20 shows forward link signals 2080 from the base station 2040 to the remote units 2020, 2030, and 2050 and reverse link signals 2090 from the remote units 2020, 2030, and 2050 to base stations 2040.

In FIG. 20, remote unit 2020 is shown as a mobile telephone, remote unit 2030 is shown as a portable computer, and remote unit 2050 is shown as a fixed location remote unit in a wireless local loop system. For example, the remote units may be a mobile phone, a hand-held personal communication systems (PCS) unit, a portable data unit such as a personal data assistant, a GPS enabled device, a navigation device, a set top box, a music player, a video player, an entertainment unit, a fixed location data unit such as a meter reading equipment, or other communications device that store or retrieve data or computer instructions, or combinations thereof. The remote device may also be an integrated optical circuit, an ultra-high resolution display, a lighting fixture or even a light bulb. Although FIG. 20 illustrates remote units according to the aspects of the disclosure, the disclosure is not limited to these exemplary illustrated units. Aspects of the disclosure may be suitably employed in many devices, which include the disclosed light emitter structures.

Figure 21:
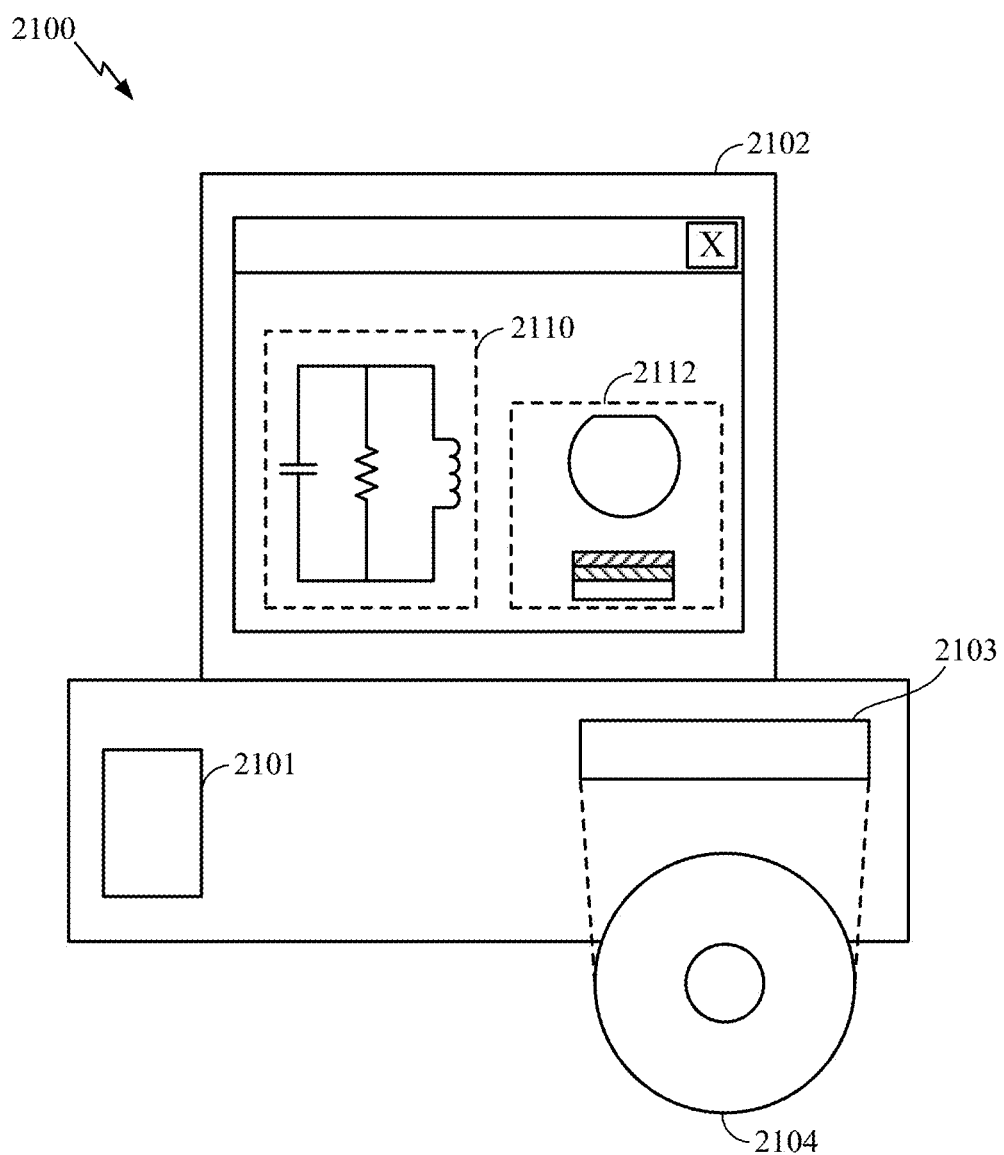
FIG. 21 is a block diagram illustrating a design workstation used for circuit, layout, and logic design of a semiconductor component according to one configuration.

FIG. 21 is a block diagram illustrating a design workstation used for circuit, layout, and logic design of a semiconductor component, such as the light emitter structures disclosed above. A design workstation 2100 includes a hard disk 2101 containing operating system software, support files, and design software such as Cadence or OrCAD. The design workstation 2100 also includes a display 2102 to facilitate design of a circuit 2110 or a semiconductor component 2112 such as a light emitter structure. A storage medium 2104 is provided for tangibly storing the design of the circuit 2110 or the semiconductor component 2112. The design of the circuit 2110 or the semiconductor component 2112 may be stored on the storage medium 2104 in a file format such as GDSII or GERBER. The storage medium 2104 may be a CD-ROM, DVD, hard disk, flash memory, or other appropriate device. Furthermore, the design workstation 2100 includes a drive apparatus 2103 for accepting input from or writing output to the storage medium 2104.

Data recorded on the storage medium 2104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 2104 facilitates the design of the circuit 2110 or the semiconductor component 2112 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to the second host substrate 402 or electronic device. Of course, if the second host substrate 402 or electronic device is inverted, above becomes below, and vice versa. Additionally, if oriented sideways, above and below may refer to sides of a second host substrate 402 or electronic device. Moreover, the scope of the present application is not intended to be limited to the particular configurations of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A light emitting structure, comprising:
    at least one light emitting element arranged in a transparent dielectric material, the light emitting element comprising:
        a semiconductor nanostructure arranged in a display orientation different from a growth orientation of the semiconductor nanostructure,
        a well layer on the semiconductor nanostructure, and
        a capping layer on the well layer; and
    a contact layer coupled to the at least one light emitting element.

2. The light emitting structure of claim 1, in which the light emitting element comprises a light emitting diode (LED).

3. The light emitting structure of claim 1 in which the transparent dielectric material is selected from a group consisting of silicon nitride ($SiN_x$), silicon oxide ($SiO_2$), silicon oxy-nitride (SiON), fluorinated silicon oxide (SiOF), silicon oxy-carbide (SiOC), hafnium oxide ($HfO_2$), hafnium-silicate (HfSiO), nitride hafnium-silicate (HfSiON), zirconium oxide ($ZrO_2$), aluminum oxide ($Al_2O_3$), barium strontium titanate (BST), lead zirconate titanate (PZT), zirconium silicate ($ZrSiO_2$), or tantalum oxide ($TaO_2$).

4. The light emitting structure of claim 1 in which a plurality of N-type semiconductor nanostructures are positioned to create a photonic crystal.

5. The light emitting structure of claim 1,
    in which the N-type semiconductor nanostructure comprises a plurality of N-type gallium nitride (GaN) nanostructures disposed on a surface of the transparent dielectric material, in which the well layer comprises a plurality of indium gallium nitride (InGaN) quantum wells, each disposed on a corresponding one of the plurality of N-type GaN nanostructures, and in which a P-type capping layer comprises a plurality of P-type GaN capping layers, each disposed on a corresponding one of the plurality of InGaN quantum wells.

6. The light emitting structure of claim 1, further comprising a coalesced N-type layer coupled to the N-type semiconductor nanostructure and supporting the at least one light emitting element.

7. The light emitting structure of claim 1, in which the contact layer comprises:
    a current distribution layer coupled to the P-type capping layer of the at least one light emitting element; and
    a conductive contact on the current distribution layer.

8. The light emitting structure of claim 7, in which an opening in the transparent dielectric material exposes the conductive contact.

9. The light emitting structure of claim 1, integrated into a mobile phone, a set top box, a music player, a video player, an entertainment unit, a navigation device, a computer, a light bulb, a lighting fixture, a hand-held personal communication systems (PCS) unit, a portable data unit, and/or a fixed location data unit.

10. A method for manufacturing a light emitting structure, comprising:
    fabricating at least one light emitting element in a transparent dielectric material, the light emitting element comprising:
        a semiconductor nanostructure arranged in a display orientation different from a growth orientation of the semiconductor nanostructure,
        a well layer on the semiconductor nanostructure, and
        a capping layer on the well layer; and
    forming a contact layer coupled to the at least one light emitting element.

11. The method of claim 10, in which fabricating the light emitting structure further comprises:
    forming a sheet including a plurality of semiconductor nanostructures surrounded by an infill layer on a first host substrate in the growth orientation;
    transferring the plurality of semiconductor nanostructures off the sheet to a second host substrate in the display orientation;
    growing a crystal layer on individual ones of the plurality of semiconductor nanostructures to form the well layer;
    forming the capping layer on the well layer; and
    patterning and etching the capping layer and the transparent dielectric material to form the light emitting structure.

12. The method of claim 11 in which transferring including the plurality of semiconductor nanostructures off the sheet comprises:
    physically shearing the plurality of semiconductor nanostructures from the first host substrate; and
    dispersing the plurality of semiconductor nanostructures from the first host substrate onto a matrix layer.

13. The method of claim 11 in which transferring the plurality of semiconductor nanostructures comprises encapsulating the plurality of semiconductor nanostructures in an organic or inorganic layer, which then can be resolved in a suitable solvent to release the plurality of semiconductor nanostructures.

14. The method of claim 11 in which growing the crystal layer comprises re-growing group-III nitride layers on group-III nitride nanostructures removed from the first host substrate and transferred to a matrix layer.

15. The method of claim 11, further comprising growing a coalescent layer on two or more of the semiconductor nanostructure.

16. The method of claim 15, further comprising coalescing the two or more of the semiconductor nanostructure to form a substrate in which a semiconductor nanostructure sheet that exposes a predetermined crystallographic plane is coalesced to form the semiconductor nanostructure sheet of a same orientation as the substrate.

17. The method of claim 11 in which the plurality of semiconductor nanostructures are comprised of one or more heterostructures, and the well layer comprises an InGaN quantum well layer grown on the plurality of semiconductor nanostructures before or after the transferring of the plurality of semiconductor nanostructures.

18. The method of claim 11 further comprising one or more P-N junctions formed before or after the transferring of the plurality of semiconductor nanostructures.

19. The method of claim 10 in which the plurality of semiconductor nanostructures comprise N-type GaN nanostructure sheets, the well layer comprises InGaN quantum wells and the capping layer comprises a P-type GaN, in which forming the contact layer comprises forming conductive contacts on an N-type layer and a P-type GaN layer.

20. The method of claim 10 further comprising forming one or more current distribution layers.

21. The method of claim 10 further comprising forming optical cavities and/or optical waveguides.

22. The method of claim 10, further comprising fabricating an integrated optical circuit using photonic crystal effects.

23. The method of claim 10, further comprising individually electrically addressing the light emitting element to form an ultra-high resolution display.

24. The method of claim 10, further comprising integrating the light emitting structure into a mobile phone, a set top box, a music player, a video player, an entertainment unit, a navigation device, a computer, a light bulb, a lighting fixture, a hand-held personal communication systems (PCS) unit, a portable data unit, and/or a fixed location data unit.

25. A light emitting structure, comprising:
    at least one light emitting element arranged in a transparent dielectric material, the light emitting element comprising:
        a means for coupling molecular structures arranged in a display orientation different from a growth orientation of the molecular structure coupling means,
        a well layer on the molecular structure coupling means, and
        a capping layer on the well layer; and
    a contact layer coupled to the at least one light emitting element.

26. The light emitting structure of claim 25, integrated into a mobile phone, a set top box, a music player, a video player, an entertainment unit, a navigation device, a computer, a light bulb, a lighting fixture, a hand-held personal communication systems (PCS) unit, a portable data unit, and/or a fixed location data unit.

* * * * *